United States Patent
Higashii et al.

(10) Patent No.: US 8,100,555 B2
(45) Date of Patent: Jan. 24, 2012

(54) LIGHTING APPARATUS

(75) Inventors: Mitsutoshi Higashii, Nagano (JP); Kei Murayama, Nagano (JP); Yuichi Taguchi, Nagano (JP); Masahiro Sunohara, Nagano (JP); Akinori Shiraishi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/851,722

(22) Filed: Aug. 6, 2010

(65) Prior Publication Data

US 2010/0321936 A1    Dec. 23, 2010

Related U.S. Application Data

(62) Division of application No. 11/984,930, filed on Nov. 26, 2007, now Pat. No. 7,794,112.

(30) Foreign Application Priority Data

Nov. 27, 2006 (JP) .................. 2006-318940

(51) Int. Cl.
*F21V 1/00* (2006.01)

(52) U.S. Cl. .............. 362/248; 362/84; 362/249.02; 362/260; 362/311.02; 362/545; 257/98; 313/492

(58) Field of Classification Search ........... 257/98–100; 313/492, 502; 362/84, 248, 249.02, 260, 362/311.02, 539, 545, 800

See application file for complete search history.

(56) References Cited

U.S. PATENT DOCUMENTS

| | | | |
|---|---|---|---|
| 7,019,334 B2 | 3/2006 | Yatsuda et al. | |
| 7,246,930 B2 | 7/2007 | Yatsuda et al. | |
| 7,815,343 B2 * | 10/2010 | Nii et al. | ............ 257/98 |
| 2005/0041434 A1 | 2/2005 | Yatsuda et al. | |
| 2005/0057917 A1 | 3/2005 | Yatsuda et al. | |
| 2005/0201109 A1 * | 9/2005 | Shimura | .......... 362/382 |

FOREIGN PATENT DOCUMENTS

| | | |
|---|---|---|
| EP | 1 487 025 A2 | 12/2004 |
| JP | 6-7102 | 1/1994 |
| JP | 10-256607 A | 9/1998 |
| JP | 11-087782 A | 3/1999 |
| JP | 2003-218398 A | 7/2003 |
| JP | 2003-347601 A | 12/2003 |
| JP | 2005-005193 A | 1/2005 |
| JP | 2005-327820 | 11/2005 |

OTHER PUBLICATIONS

Dictionary.com; Random House Dictionary; Definition of "spraying".

* cited by examiner

*Primary Examiner* — Stephen F Husar
(74) *Attorney, Agent, or Firm* — Drinker Biddle & Reath LLP

(57) ABSTRACT

It is a lighting apparatus 10 that has a light emitting element 16, a light emitting element housing 15 having a concave portion 28 that accommodates the light emitting element 16, and an optically transparent member 18 that airproofs a space B formed by the concave portion 28 and transmits light emitted from the light emitting element 16. The concave portion 28 is shaped to become wider toward the optically transparent member 18 from the bottom surface 28A of the concave portion 28. The lighting apparatus 10 is provided with a light shielding member 12 for shielding a part of light emitted from the light emitting element 16 is provided on the optically transparent member 18.

4 Claims, 21 Drawing Sheets

LIGHTING APPARATUS

This is a divisional application of application Ser. No. 11/984,930, filed on Nov. 26, 2007 now U.S. Pat. No. 7,794,112, which is incorporated by reference herein in its entirety.

BACKGROUND OF THE INVENTION

The present invention relates to a lighting apparatus and, more particularly, to a lighting apparatus for irradiating light, which is emitted from a light emitting device, in a predetermined direction.

Some lighting apparatus is configured to irradiate light, which is emitted from a light emitting device, in a predetermined direction (see, e.g., FIG. 1). Such a lighting apparatus is employed in, e.g., a spotlight (to be used for lighting in a theater and a television studio) and a headlight of a vehicle.

FIG. 1 is a cross-sectional view illustrating a conventional lighting apparatus. In FIG. 1, reference character K designates light irradiated in a predetermined direction, among light rays irradiated from a lighting apparatus 200.

Referring to FIG. 1, the conventional light emitting apparatus 201 has a light emitting device 201 and a light shielding plate 202. The light emitting device 201 has a light emitting element housing 205, a light emitting element 206, a reflection film 207, and an optically transparent member 208. The light emitting element housing 205 has a housing body 211, through vias 212, first connection pads 213, and second connection pads 214.

The housing body 211 has a concave portion 216, in which the light emitting element 206 is accommodated, and through holes 218. The concave portion 216 is configured to become wider toward the optically transparent member 208 from the bottom surface 216A thereof. Consequently, the side surface 216B of the concave portion 216 is formed as an inclined surface. Each of the through hole 218 is formed to penetrate through the housing body 211 corresponding to the bottom surface 216A of the concave portion 216.

Each of the through vias 212 is provided in an associated one of the through holes 218. The top portion of each of the though vias 212 is connected to an associated one of the first connection pads 213. The bottom portion of each of the though vias 212 is connected to an associated one of the second connection pads 214.

Each of the first connection pads 213 is provided on the bottom surface 216A of the concave portion 216 corresponding to a position at which an associated one of the through via 212 is formed. Each of the first connection pads 213 is connected to an associated one of the through vias 212 and an associated one of the bumps 221. Each of the first connection pads 213 is connected to the light emitting element 206 through an associated one of the bumps 221.

Each of the second connection pads 214 is provided on the bottom surface 211B of the housing body 211 corresponding to a position at which an associated one of the through vias 212 is formed. Each of the second connection pads 214 is a pad serving as an external connection terminal to be connected to a mount board, such as a motherboard (not shown).

The light emitting element 206 is accommodated in the concave portion 216 provided in the housing body 211. The light emitting element 206 has an electrode pad 23. The light emitting element 206 is electrically connected to the light emitting element 206 through the bump 221. The light emitting element 206 is a device operative to emit light from the entire surface thereof.

The reflection film 207 is provided to cover the side surface 216B of the concave portion 216. The reflection film 207 reflects light emitted from the side surface and the bottom surface of the light emitting element 206. The reflection film 207 serves to assure the luminance of the lighting apparatus 200.

The optically transparent member 208 is provided on the top surface 211A of the housing body 211 so as to air-proof a space J formed by the concave portion 216 (see, e.g., Patent Document 1).

The light shielding plate 202 is provided at a position spaced from the light emitting device 201. The light shielding plate 202 shields apart of light emitted from the light emitting device 201 to thereby serve as a mask used for emitting light K in a predetermined direction (e.g., Patent Document 2).
[Patent Document 1] JP-A-2005-327820
[Patent Document 2] JP-UM-A-6-7102

However, in the conventional lighting apparatus 200, the light shielding plate 202 is provided at a position spaced from a light emitting device 201.

SUMMARY OF THE INVENTION

Accordingly, an object of the invention is to provide a lighting apparatus that can be miniaturized.

To achieve the foregoing object of the invention, according to a first aspect of the invention, there is provided with a lighting apparatus including:
  a light emitting device including:
  one or a plurality of light emitting elements,
  a light emitting element housing having a concave portion accommodating the one or the plurality of light emitting elements, and
  an optically transparent member that airproofs a space formed by the concave portion and transmits light emitted from the one or the plurality of light emitting elements,
  the concave portion being shaped to become wider with distance from, a bottom surface of the concave portion, and
  a light shielding member, provided on the optically transparent member, for shielding a part of light emitted from the one or the plurality of light emitting element, wherein
  light emitted from the one or the plurality of light emitting elements is irradiated in a predetermined direction.

According to a second aspect of the invention, there is provided with the lighting apparatus according to the first aspect, wherein
  the light shielding member is provided on a surface of the optically transparent member, the surface being exposed to the space.

According to a third aspect of the invention, there is provided with the lighting apparatus according to the first aspect, further including:
  a reflection member, provided on a side surface of the concave portion and/or a bottom surface of the concave portion, for reflecting light emitted from the one or the plurality of light emitting elements.

According to a fourth aspect of the invention, there is provided with the lighting apparatus according to any one of the first to third aspects, wherein
  the light shielding member is a metal film whose surface for receiving light emitted from the one or the plurality of light emitting elements is formed as a substantial mirror surface.

According to a fifth aspect of the invention, there is provided with the lighting apparatus according to any one of the first to forth aspects, further including:
  a resin containing a fluorescent material, which covers the one or the plurality of light emitting elements; and a seal resin, with which the space is filled, for sealing the one or the plurality of light emitting elements.

According to a sixth aspect of the invention, there is provided with the lighting apparatus according to the fifth aspect, wherein a through-portion for introducing the seal resin into the space is provided in the optically transparent member.

According to a thirteenth aspect of the invention, there is provided with the lighting apparatus according to the first aspect, wherein the light emitting element is an LED.

According to the invention, a light shielding member for shielding a part of light emitted from one or a plurality of light emitting elements is provided on the optically transparent member serving as a composing element of the light emitting device. Thus, as compared with the case of providing a light shielding member in the optically transparent member, the lighting apparatus can be miniaturized.

According to a seventh aspect of the invention, there is provided with a lighting apparatus including:

a light emitting device including:

one or a plurality of light emitting elements covered by a resin containing a fluorescent material, a light emitting element housing having a concave portion accommodating the one or the plurality of light emitting elements, and a seal resin that is provided in a space formed by the concave portion and seals the one or the plurality of light emitting elements, the concave portion being shaped to become wider with distance from a bottom surface of the concave portion, and a plate body provided on the top surface of the light emitting element housing and the seal resin, wherein light emitted from the one or the plurality of light emitting elements is irradiated in a predetermined direction, and a through-portion is provided in the plate body and configured to allow light emitted from the one or the plurality of light emitting elements to pass therethrough in the predetermined direction.

According to an eighth aspect of the invention, there is provided with the lighting apparatus according to the seventh aspect, further including:

a first reflection member, provided on a side surface of the concave portion and/or a bottom surface of the concave portion, for reflecting light emitted from the one or the plurality of light emitting elements.

According to a ninth aspect of the invention, there is provided with the lighting apparatus according to the eighth aspect, further including:

a second reflection member, provided on the plate body, for reflecting light emitted by the one or the plurality of light emitting elements toward the first reflection member.

According to a fourteenth aspect of the invention, there is provided with the lighting apparatus according to the seventh aspect, wherein the light emitting element is an LED.

According to the invention, a plate body for shielding a part of light emitted from one or a plurality of light emitting elements is provided on the light emitting element housing and the seal resin serving as composing elements of the light emitting device. Also, a through-portion, through which light emitted from one or a plurality of light emitting elements is passed in a predetermined direction, is provided in the plate body. Thus, as compared with the case of providing a light shielding member in the optically transparent member, the lighting apparatus can be miniaturized.

According to a tenth aspect of the invention, there is provided with a lighting apparatus including:

a light emitting device including:

one or a plurality of light emitting elements covered by a resin containing a fluorescent material, a light emitting element housing having a concave portion accommodating the one or the plurality of light emitting elements, and a seal resin that is provided in a space formed by the concave portion and seals the one or the plurality of light emitting elements, the concave portion being shaped to become wider with distance from a bottom surface of the concave portion, and a light shielding member, provided on the seal resin, for shielding a part of light emitted by the one or the plurality of light emitting elements, wherein light emitted from the one or the plurality of light emitting elements is irradiated in a predetermined direction.

According to an eleventh aspect of the invention, there is provided with the lighting apparatus according to the tenth aspect, further including:

a reflection member, provided on a side surface of the concave portion and/or a bottom surface of the concave portion, for reflecting light emitted from the one or the plurality of light emitting elements.

According to a twelfth aspect of the invention, there is provided with the lighting apparatus according to the tenth or eleventh aspect, wherein the light shielding member is a metal film whose surface for receiving light emitted from the one or the plurality of light emitting elements is formed as a substantial mirror surface.

According to a fifteenth aspect of the invention, there is provided with the lighting apparatus according to the tenth aspect, wherein the light emitting element is an LED.

According to the invention, a light shielding member for shielding a part of light emitted from one or a plurality of light emitting elements is provided on the seal resin serving as a composing element of the light emitting device. Thus, as compared with the case of providing a light shielding member in the optically transparent member, the lighting apparatus can be further miniaturized.

According to the invention, the miniaturization of the lighting apparatus can be achieved.

DETAILED DESCRIPTION OF THE PREFERRED EMBODIMENTS

Next, embodiments of the invention are described below with reference to the accompanying drawings.

First Embodiment

Figure 2:
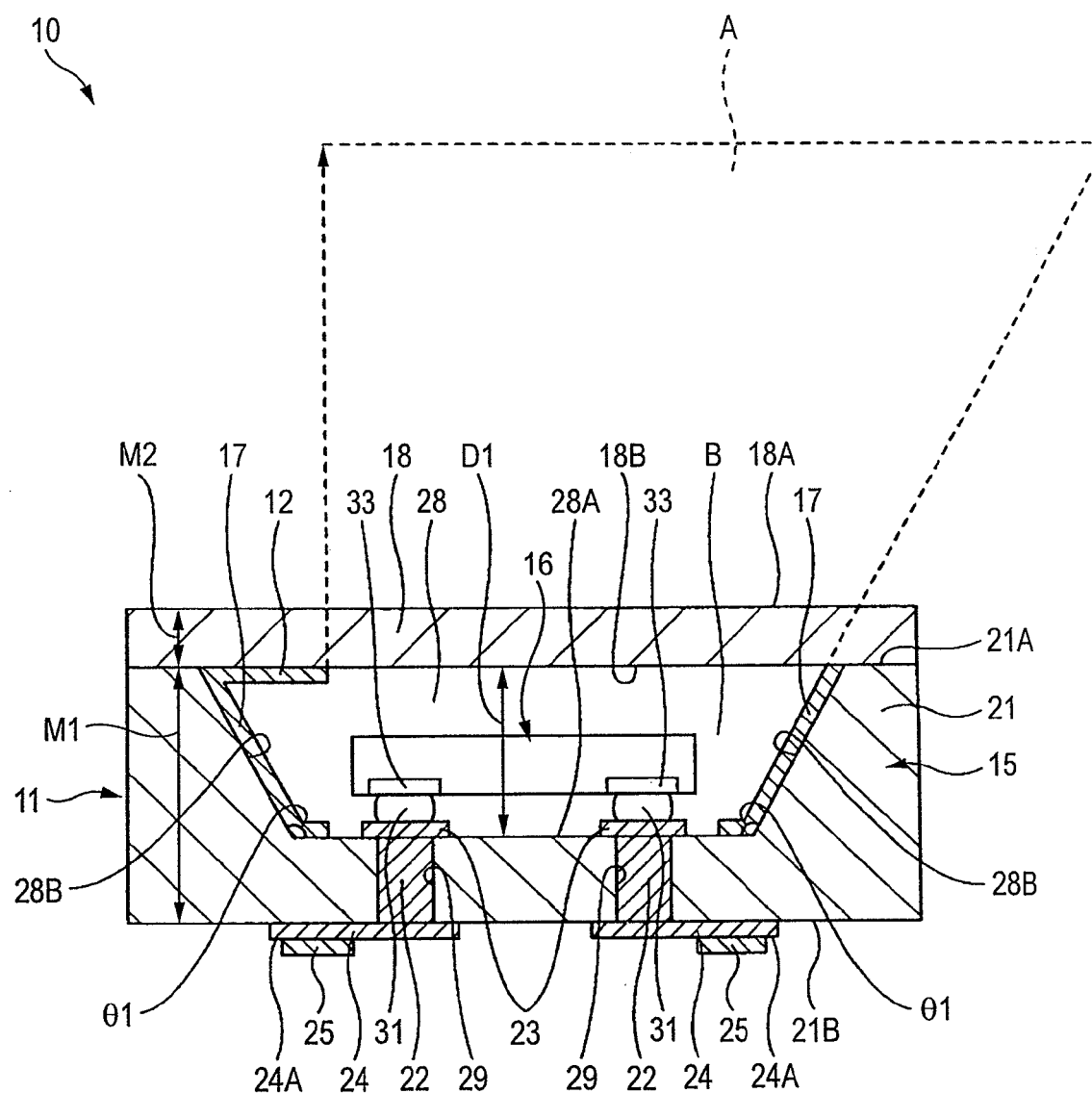
FIG. 2 is a cross-sectional view illustrating a lighting apparatus according to a first embodiment of the invention.
Figure 3:
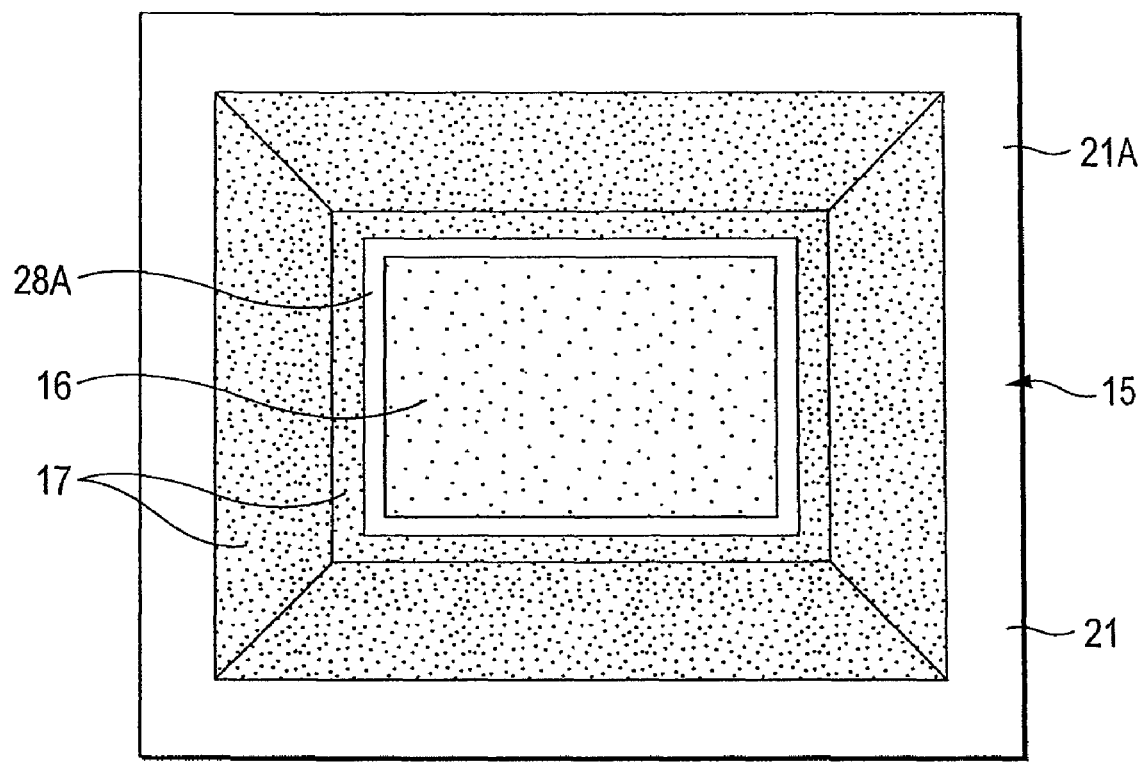
FIG. 3 is a plan view illustrating a light emitting element housing in which a light emitting element shown in FIG. 2 is accommodated.

FIG. 2 is a cross-sectional view illustrating a lighting apparatus according to a first embodiment of the invention. FIG. 3 is a plan view illustrating a light emitting element housing in which a light emitting element shown in FIG. 2 is accommodated. In FIG. 2, reference character A denotes light irradiated from the lighting apparatus 10 in a predetermined direction.

Referring to FIGS. 2 and 3, the lighting apparatus 10 according to the first embodiment has a light emitting device 11 and a light shielding member 12. The light emitting device 11 has a light emitting element housing 15, a light emitting element 16, reflection members 17, and a light shielding member 18.

The light emitting element housing 15 has a housing body 21, through vias 22, first connection pads 23, wiring patterns 24, and second d connection pads 25.

The housing body 21 has a concave portion 28, in which the light emitting element 16 is accommodated, and through holes 29. The concave portion 28 is shaped to become wider toward the optically transparent member 18 from the bottom surface 28A of the concave portion 28 (i.e., as spaced from the bottom surface 28A of the concave portion 28). Consequently, the side surface 28B of the concave portion 28 is formed as an inclined surface. An angle θ between the side surface 28B of the concave portion 28 and the bottom surface 28A of the concave portion 28 can be set to be within a range from 120 degrees to 160 degrees. The depth D1 of the concave portion 28 can be set at, e.g., 250 µm.

The through hole 29 is formed to penetrate through the housing body 21 of a part corresponding to the bottom surface 28A of the concave portion 28. For example, a resin, ceramics, alumina, silicon, and so forth can be used as the material of the housing body 21. Incidentally, in the case of using silicon as the material of the housing body 21, an insulating film (not shown) for insulating the housing body 21 from the through vias 22, the first connection pads 23 and the wiring patterns 24 is required to be provided on a part of the housing body 21, which corresponds to a region in which the through vias 22, the first connection pads 23, and the wiring patterns 24 are formed. For example, a 1 µm-thick oxidized film can be used as the insulating film. The thickness M1 of the housing body 21 can be set at, for example, 350 µm.

Each of the through vias 22 is provided in an associated one of the through holes 29. The top portion of each of the through vias 22 is connected to an associated one of the first connection pads 23. The bottom portion of each of the through vias 22 is connected to an associated one of the second connection pads 24. For example, Cu can be used as the material of each of the through vias 22. The through vias 22 can be formed by, for example, a plating method.

Each of the first connection pads 23 is provided on the bottom surface 28A of the concave portion 28 corresponding to a position at which an associated one of the through vias 22 is formed. Each of the first connection pads 23 is connected to the associated through via 22 and to the associated bump 31. Also, each of the first connection pads 23 is electrically connected to the light emitting element 16 through the associated bump 31. For example, Cu can be used as the material of each of the first connection pads 23. Each of the first connection pads 23 can be formed by a plating method.

Each of the wiring patterns 24 is provided on the bottom surface 21B of a part of the housing body 21 corresponding to the position at which the associated through via 22 is formed. Each of the wiring patterns 24 is connected to the associated through via 22. Each of the wiring patterns 24 is electrically connected to the associated first connection pad 23 through the associated through-via 22. Each of the wiring patterns 24 adjusts the providing position of the associated second connection pad 25 so that the associated second connection pad 25 corresponds to the providing position of the pad of a mount board (not shown), such as a motherboard. Also, each of the wiring patterns 24 has a function of radiating heat, which is generated at emission of light from the light emitting element 16, to the outside of the lighting apparatus 10.

For example, Cu can be used as the material of each of the wiring patterns 24. Each of the first connection pads 23 can be formed by a plating method.

Each of the second pads 25 is provided on the bottom surface 24A of the associated wiring pattern 24. Each of the second connection pads 25 is electrically connected through the associated wiring pattern 24 to the light emitting element 16. Each of the second connection pads 25 is connected to the mount board (not shown) such as a motherboard. Ni/Au laminated films, in each of which is an Ni-layer and an Au-layer are stacked in this order from the side of the associated wiring pattern 24, are used as the second connection pads 25. The thickness of the Ni-layer can be set at, for example, 5 µm. The thickness of the Au-layer can be set at, for example, 0.5 µm.

The light emitting element 16 is accommodated in the concave portion 28 of the housing body 21. The light emitting element 16 has at least electrode pads 33. Each of the electrode pads 33 is electrically connected to the associated first connection pad 23 through the associated bump 31. The light emitting element 16 emits light from the entire surface thereof. For example, a light emitting diode and laser diode can be used as the light emitting element 16.

The reflection member 17 is provided on each of the side surface 28B of the concave portion 28 and on the bottom surface 28A adjoining the side surface 28B thereof. The reflection members 17 are members for reflecting light emitted from the side surfaces and the bottom surface of the light emitting element 16.

Thus, the reflection members 28 are provided on the side surfaces 28B of the concave portion 28 and the bottom surface 28A adjoining the side surfaces 28B of the concave portion 28. Consequently, light emitted from the side surfaces and the bottom surface of the light emitting element 16 is reflected. Thus, the reflected light can be radiated to the outside of the lighting apparatus 10. Accordingly, the luminance of the lighting apparatus 10 can be enhanced.

For example, a metal plate and a metal film, whose surfaces adapted to receive light from the light emitting element 16 are formed as a substantial mirror surface, can be used as the reflection members 17. For instance, Ag and Al can be used as the material of the metal plate. For example, Ag-film and al-film can be used as the metal film. Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

The optically transparent member 18 is provided on the top surface 21A of the housing body 21 so as to airproof the space B formed by the concave portion 28. The optically transparent member 18 is constituted by a material that can transmit light emitted from light emitting element 16. For example, glass can be used as the material of the optically transparent member 18. The thickness M2 of the optically transparent member 18 can be set at, for example, 200 μm.

Figure 4:
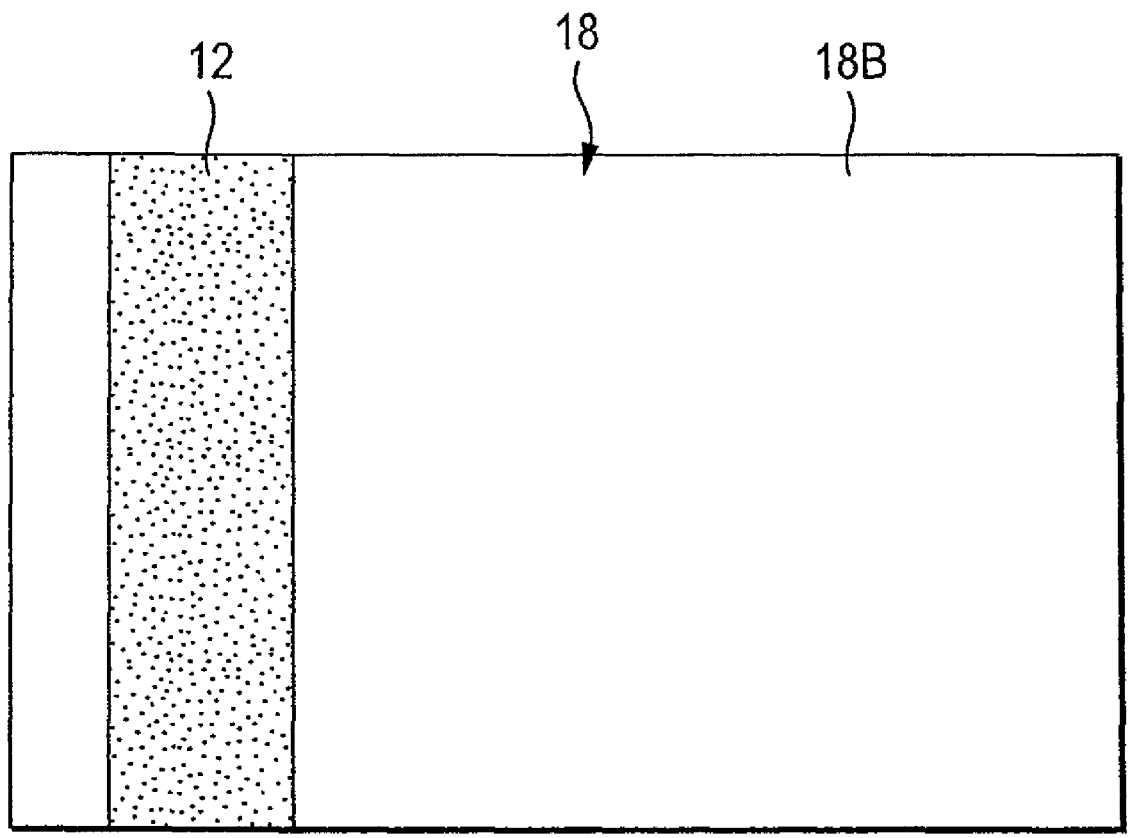
FIG. 4 is a plan view illustrating an optically transparent member provided with a light shielding member shown in FIG. 2.

FIG. 4 is a plan view illustrating the optically transparent member provided with the light shielding member shown in FIG. 2.

Referring to FIGS. 2 and 4, the light shielding member 12 is provided on the surface 18B of the optically transparent member 18. The surface 18B of the optically transparent member 18 is a surface thereof exposed to the airproofed space B. The light shielding member 12 is a member for irradiating light, which is emitted by the light emitting element 16, only in a predetermined direction by shielding a part of light emitted by the light emitting element 16.

Figure 1:
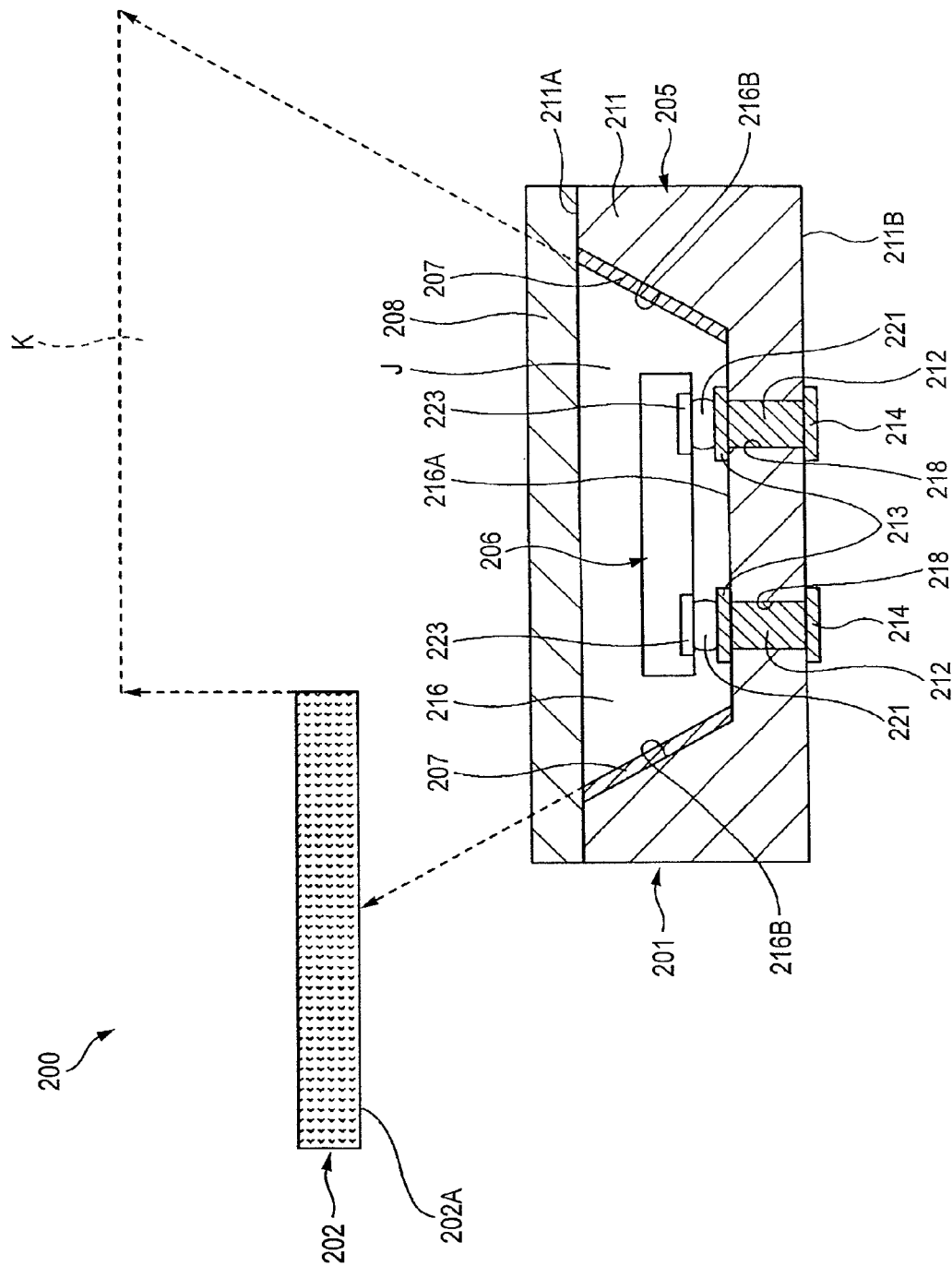
FIG. 1 is a cross-sectional view illustrating a conventional lighting apparatus.

Thus, the light shielding member 12 adapted to shield a part of light emitted by the light emitting element 16 is provided on the surface 18B of the optically transparent member 18 that is one of composing elements of the light emitting device 11. Consequently, as compared with the conventional lighting apparatus 200 (see FIG. 1) provided with the light shielding plate 202 at the position spaced from the light emitting device 201, the lighting apparatus 10 can be miniaturized.

Further, the deterioration of the light shielding member 12 can be suppressed by providing the light shielding member 12 on the surface 18B of the optically transparent member 18, which is exposed to the airproofed space B.

For example, a metal film, whose surface receiving light emitted from the light emitting element 16 is formed as a substantial mirror surface, can be used as the light shielding member 12. For instance, Ag-film and Al-film can be used as the metal film. The Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

According to the lighting apparatus of the present embodiment, the light shielding member 12 for shielding a part of light emitted by the light emitting element 16 is provided on the surface 18B of the optically transparent member 18 that is one of the composing elements of the light emitting device 11. Consequently, as compared with the conventional lighting apparatus 200 (see FIG. 1) provided with the light shielding plate 202 at the position spaced from the light emitting device 201, the lighting apparatus 10 can be miniaturized.

Also, the deterioration of the light shielding member 12 can be suppressed by providing the light shielding member 12 on the surface 18B of the optically transparent member 18, which is exposed to the airproofed space B.

Incidentally, in the foregoing description of the present embodiment, it has been described the case in which the reflection member 17 is provided on each of the side surfaces 28B of the concave portion 28 and the bottom surface 28A of the concave portion 28 adjoining the side surfaces 28B of the concave portion 28, by way of example. The reflection member 17 can be provided only on the side surfaces 28B of the concave portion 28 or on the bottom surface 28A of the concave portion 28.

Figure 5:
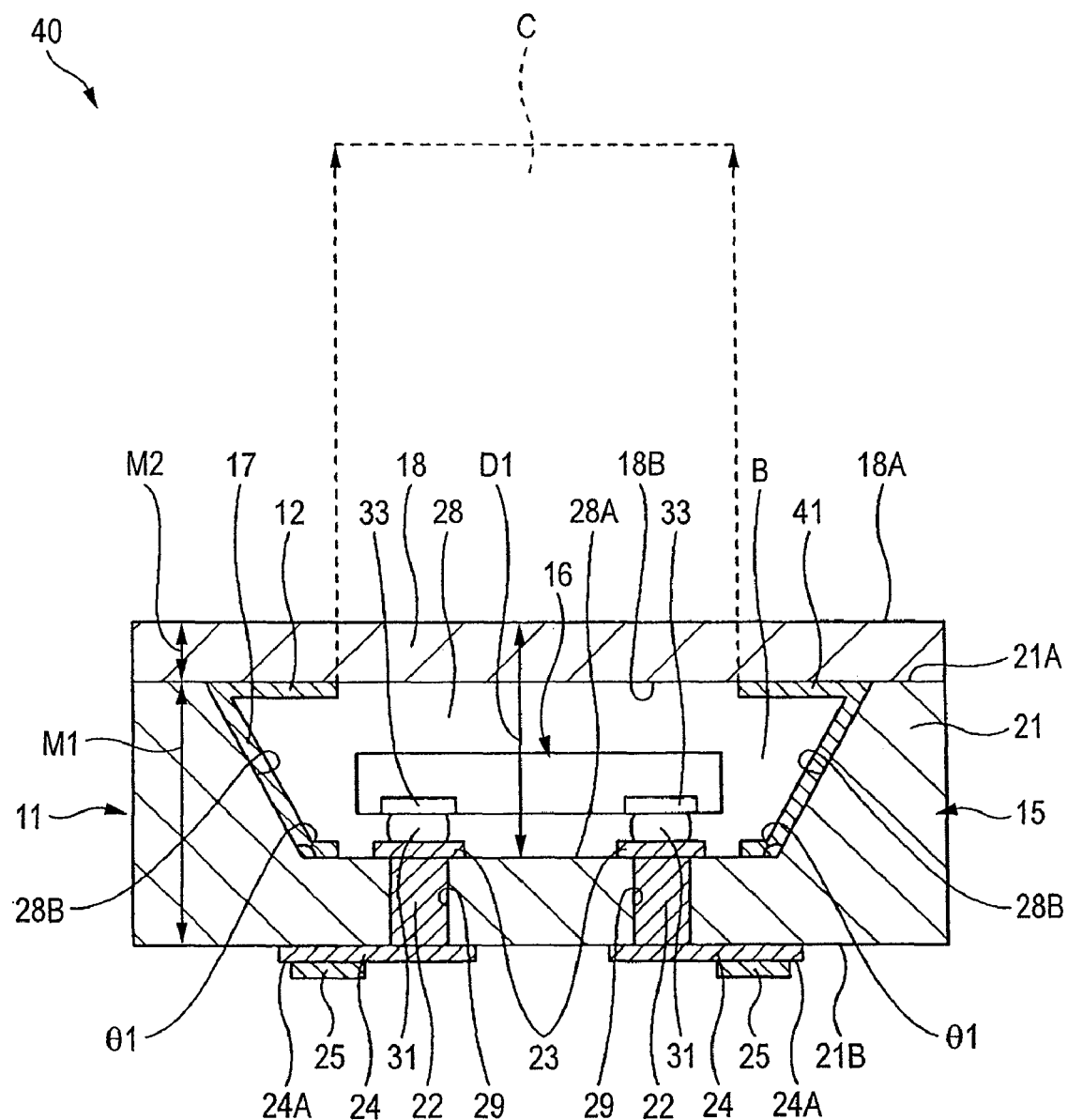
FIG. 5 is a cross-sectional view illustrating a lighting apparatus according to a modification of the first embodiment of the invention.

FIG. 5 is a cross-sectional view illustrating a lighting apparatus according to a modification of the first embodiment of the invention. In FIG. 5, reference character C represents light irradiated from a lighting apparatus 40 in a predetermined direction. In FIG. 5, like reference numeral designates a composing element similar to that of the lighting apparatus 10 of the first embodiment.

Referring to FIG. 5, the lighting apparatus 40 of the modification of the first embodiment is similar to the lighting apparatus 10 except that a light shielding member 41 is added to the constitution of the lighting apparatus 10 of the first embodiment.

Figure 6:
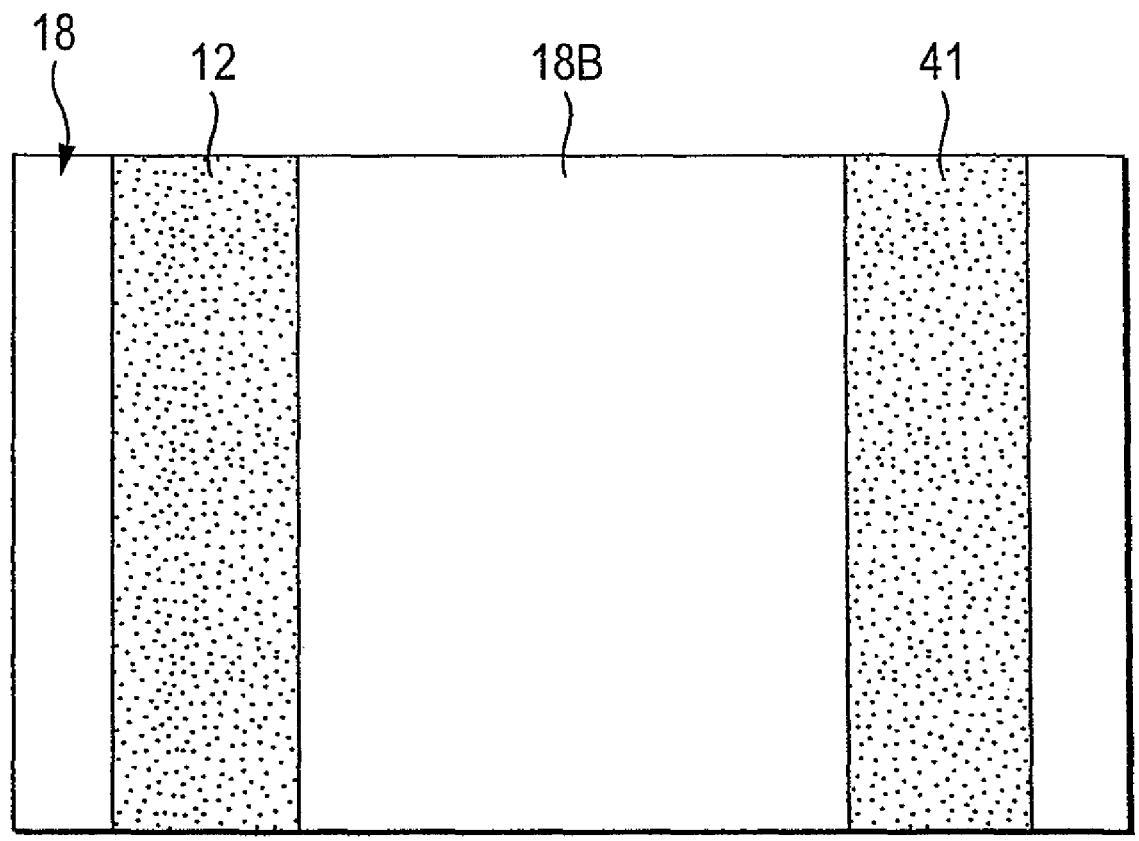
FIG. 6 is a plan view illustrating an optically transparent member provided with a plurality of light shielding members shown in FIG. 5.

FIG. 6 is a plan view illustrating an optically transparent member provided with a plurality of light shielding members shown in FIG. 5. In FIG. 6, like reference numeral designates a composing element similar to that of the lighting apparatus 40 shown in FIG. 5.

Referring to FIGS. 5 and 6, the light shielding member 41 is provided on the surface 18B of the optically transparent member 18. The light shielding member 41 is a member for shielding a part of light emitted from the light emitting element 16 and irradiating light emitted from the light emitting element in a predetermined direction, together with the light shielding member 12.

A metal film, whose surface receiving light emitted from the light emitting element 16 is formed as a substantial mirror surface, can be used as the light shielding member 41. For instance, Ag-film and Al-film can be used as the metal film. The Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

The plurality of light shielding members 12 and 41 can be provided at the optically transparent member 18, if necessary, similarly to the aforementioned lighting apparatus 40. Additionally, the light shielding member for shielding a part of light emitted from the light emitting element 16 can be provided on both sides 18A and 18B of the optically transparent member 18.

The lighting apparatus 40 of the aforementioned configuration can obtain advantages similar to those of the lighting apparatus of the first embodiment.

Second Embodiment

Figure 7:
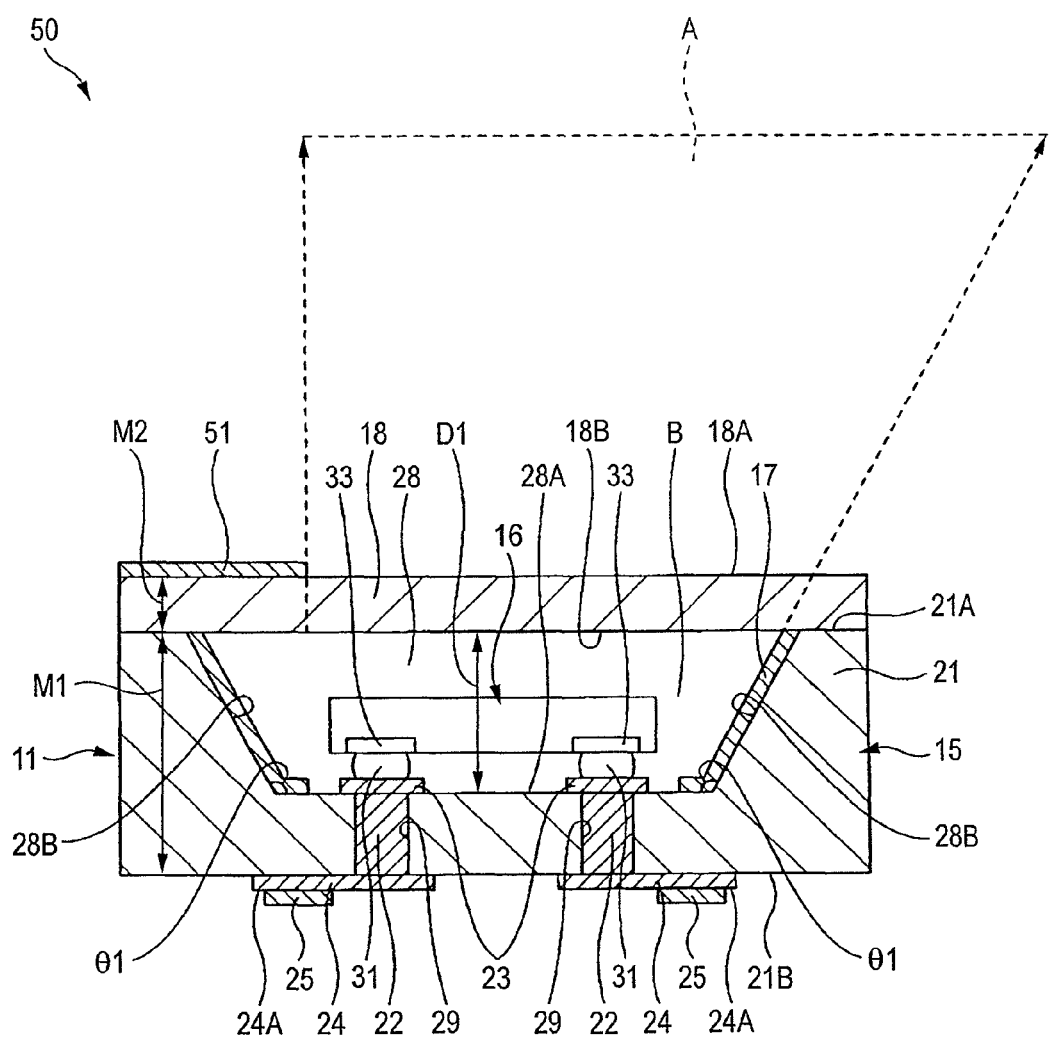
FIG. 7 is a cross-sectional view illustrating a lighting apparatus according to a second embodiment of the invention.

FIG. 7 is a cross-sectional view illustrating a lighting apparatus according to a second embodiment of the invention. In FIG. 7, like reference numeral designates a composing element similar to that of the lighting apparatus 10 of the first embodiment.

Referring to FIG. 7, a lighting apparatus 50 of the second embodiment is similar to the lighting apparatus 10 of the first embodiment, except that a light shielding member 51 is provided in the apparatus, instead of the light shielding member 12 provided in the lighting apparatus 10 of the first embodiment.

Figure 8:
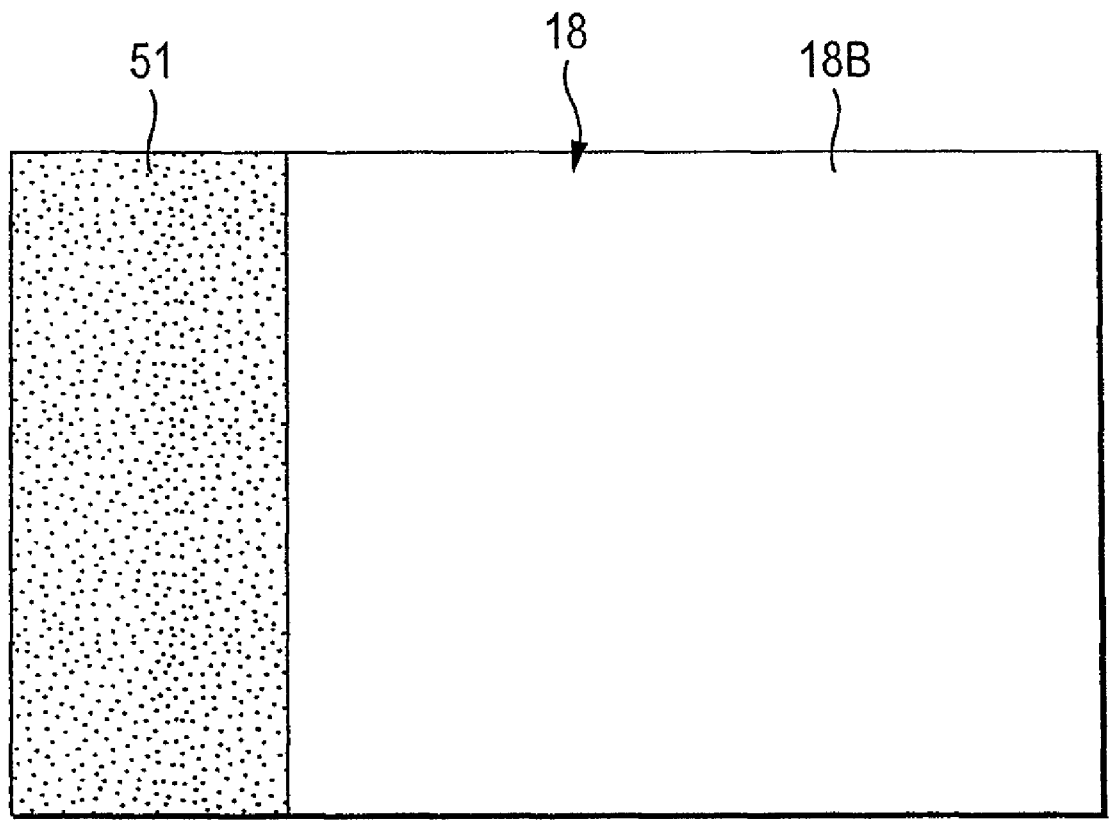
FIG. 8 is a plan view illustrating an optically transparent member provided with a light shielding member shown in FIG. 7.

FIG. 8 is a plan view illustrating an optically transparent member provided with a light shielding member shown in FIG. 7.

Referring to FIGS. 7 and 8, the light shielding member 51 is provided on the surface 18A (i.e., a surface of the optically transparent member 18, which is at a side that is not exposed to the airproofed space B) of the optically transparent member 18. That is, the light shielding member 51 is provided on the surface 18A of the optically transparent member 18, which is opposite to the surface 18B of the optically transparent member 18, on which the light shielding member 12 described in the foregoing description of the first embodiment. A metal film, whose surface receiving light emitted from the light emitting element 16 is formed as a substantial mirror surface, can be used as the light shielding member 41. For example, Ag-film and Al-film can be used as the metal film. The Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

According to the lighting apparatus of the second embodiment, the light shielding member 51 for shielding apart of light emitted by the light emitting element 16 is provided on the surface 18A of the optically transparent member 18 that is one of the composing elements of the light emitting device 11. Consequently, as compared with the conventional lighting apparatus 200 (see FIG. 1) provided with the light shielding plate 202 at the position spaced from the light emitting device 201, the lighting apparatus 50 can be miniaturized.

Incidentally, in the foregoing description of the second embodiment, it has been described the case in which the single light shielding member 51 is provided on the surface 18A of the optically transparent member 18, by way of example. However, if necessary, a plurality of light shielding members can be provided on the surface 18A and/or the surface 18B of the optically transparent member 18.

Third Embodiment

Figure 9:
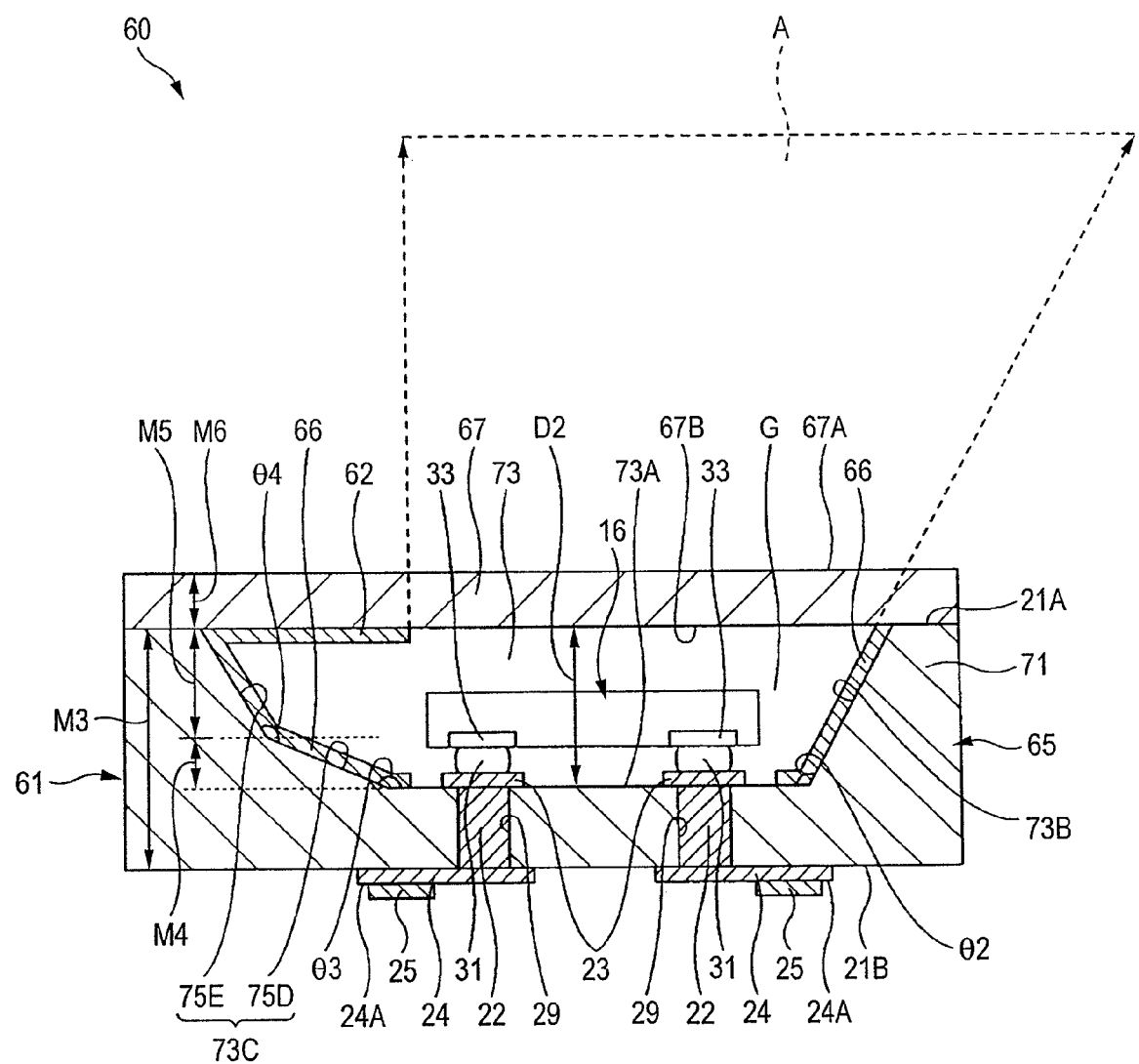
FIG. 9 is a cross-sectional view illustrating a lighting apparatus according to a third embodiment of the invention.

FIG. 9 is a cross-sectional view illustrating a lighting apparatus according to a third embodiment of the invention. In FIG. 9, reference character G designates a space formed by a concave portion 73 (hereunder referred to as a "space G"). Also, in FIG. 9, like reference numeral designates a composing element similar to that of the lighting apparatus 10 of the first embodiment.

Referring to FIG. 9, the lighting apparatus 60 of the third embodiment has a light emitting device 61 and a light shielding member 62. The light emitting device 61 is similar to the lighting apparatus 11 except that a light emitting element housing 65, a reflection member 66, and an optically transparent member 67 are provided therein instead of the light emitting element housing 15, the reflection member 17, and the optically transparent member 18 provided in the light emitting device 11 having been described in the foregoing description of the first embodiment.

The light emitting element housing 65 is constructed similarly to the housing body 21, except that the housing body 71 is provided therein instead of the light emitting element housing 15 described in the foregoing description of the first embodiment.

The housing body 71 has through-holes 29 and a concave portion 73 in which the light emitting element 16 is accommodated. The concave portion 73 is shaped to become wider toward the optically transparent member 67 placed above the bottom surface 73A of the concave portion 73 from the bottom surface 73A of the concave portion 73 (i.e., as spaced from the bottom surface 73A of the concave portion 73). The depth D2 of the concave portion 73 can be set at, for example, 250 μm. The concave portion 73 has side surfaces 73B and 73C that differ from each other in shape. The side surface 73B of the concave portion 73 is formed as an inclined surface having a substantially constant angle of inclination. The angle θ2 between the side surface 73B and the bottom surface 73A of the concave portion 73 can be set at, for example, 125 degrees.

The side surface 73C of the concave portion 73 includes a first inclined surface 75D and a second inclined surface 75E differing from the first inclined surface 75D in the angle of inclination. The first inclined surface 75D is placed to adjoin the bottom surface 73A of the concave portion 73. The angle θ3 between the first inclined surface 75D and the bottom surface 73A of the concave portion 73 can be set at, for example, 145 degrees. In a case where the thickness M3 of the housing body 71 is 350 μm, the thickness M4 of the housing body 71 at the part on which the first inclined surface 75D is formed can be set at, for example, 100 μm.

The second inclined surface 75E is placed to adjoin the first inclined surface 75D. The angle θ4 between the second inclined surface 75E and the bottom surface 73A of the concave portion 73 can be set at, for example, 125 degrees. In a case where the thickness M3 of the housing body 71 is 350 μm, the thickness M5 of the housing body 71 at the part on which the second inclined surface 75E is formed can be set at, for example, 150 μm.

For example, a resin, ceramics, alumina, silicon, and so forth can be used as the material of the housing body 71. Incidentally, in the case of using silicon as the material of the housing body 71, an insulating film (not shown) for insulating the housing body 71 from the through vias 22, the first connection pads 23 and the wiring patterns 24 is required to be provided on a part of the housing body 71, which corresponds to a region in which the through vias 22, the first connection pads 23, and the wiring patterns 24 are formed. For example, a 1 μm-thick oxidized film can be used as the insulating film. The thickness M3 of the housing body 71 can be set at, for example, 350 μm.

The reflection member 66 is provided on each of the side surfaces 73B and 73C of the concave portion 73 and on the bottom surface 73A adjoining the side surface 73B and 73C thereof. The reflection members 66 are members for reflecting light emitted from the side surfaces and the bottom surface of the light emitting element 16. Incidentally, in a case where the light shielding member 62 reflects light emitted from the light emitting element 16, the reflection 66 reflects light reflected by the shielding member 62.

Thus, the reflection members 66 are provided on the side surfaces 73B and 73C of the concave portion 73 and the bottom surface 73A adjoining the side surfaces 73B and 73C of the concave portion 73. Consequently, light emitted from the side surfaces and the bottom surface of the light emitting element 16 is reflected. Thus, the reflected light can be radiated to the outside of the lighting apparatus 60. Accordingly, the luminance of the lighting apparatus 60 can be enhanced.

For example, a metal plate and a metal film, whose surfaces adapted to receive light from the light emitting element 16 are formed as a substantial mirror surface, can be used as the reflection members 66. For instance, Ag and Al can be used as the material of the metal plate. For example, Ag-film and Al-film can be used as the metal film. Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

The optically transparent member 67 is provided on the top surface 21A of the housing body 21 so as to airproof the space G formed by the concave portion 73. The optically transparent member 67 is constituted by a material that can transmit light emitted from light emitting element 16. For example, glass can be used as the material of the optically transparent member 67. The thickness M6 of the optically transparent member 67 can be set at, for example, 200 μm.

Figure 10:
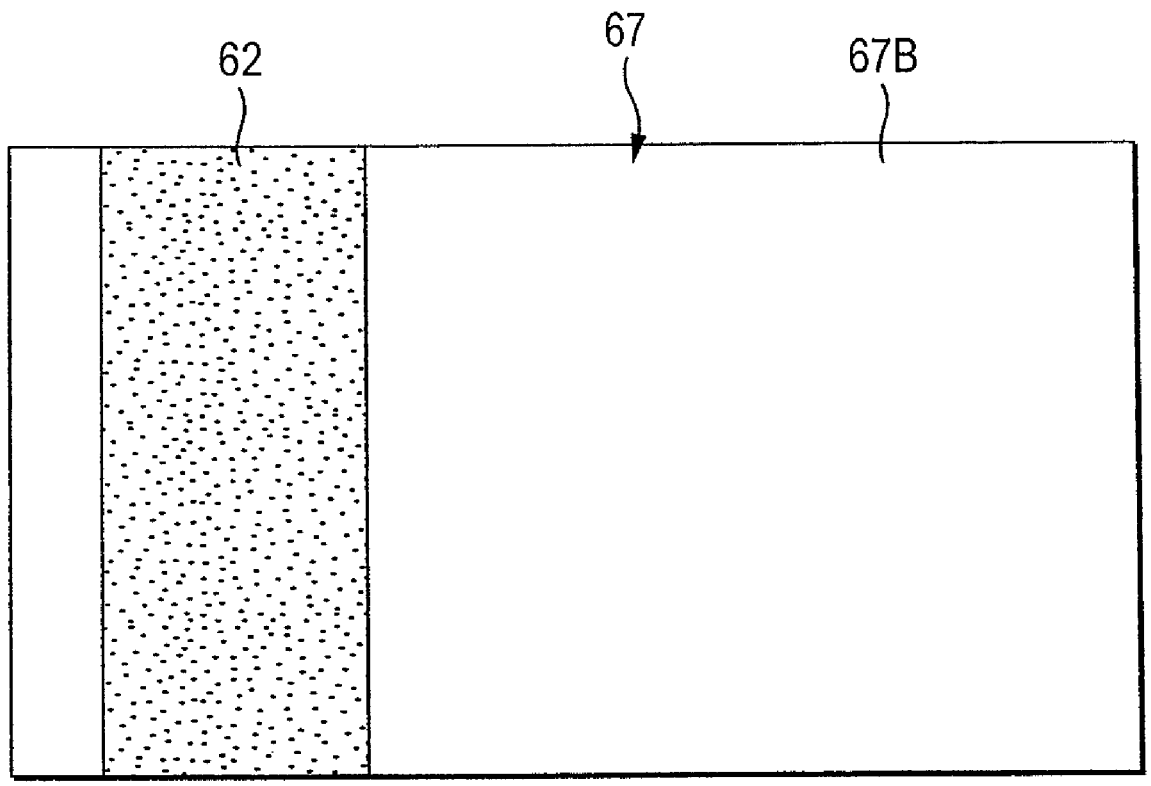
FIG. 10 is a plan view illustrating an optically transparent member provided with a light shielding member shown in FIG. 9.

FIG. 10 is a plan view illustrating an optically transparent member provided with a light shielding member shown in FIG. 9.

Referring to FIGS. 9 and 10, the light shielding member 62 is provided on the surface 67B of the optically transparent member 67. The surface 67B of the optically transparent member 67 is a surface thereof exposed to the airproofed space G. The light shielding member 62 is a member for irradiating light, which is emitted by the light emitting element 16, only in a predetermined direction by shielding a part of light emitted by the light emitting element 16.

Thus, the light shielding member 62 adapted to shield a part of light emitted by the light emitting element 16 is provided on the surface 67B of the optically transparent member 67 that is one of composing elements of the light emitting device 61. Consequently, as compared with the conventional lighting apparatus 200 (see FIG. 1) provided with the light shielding plate 202 at the position spaced from the light emitting device 201, the lighting apparatus 60 can be miniaturized.

Also, the deterioration of the light shielding member 62 can be suppressed by providing the light shielding member 62 on the surface 67B of the optically transparent member 67, which is exposed to the airproofed space G.

For example, a metal film, whose surface receiving light emitted from the light emitting element 16 is formed as a substantial mirror surface, can be used as the light shielding member 62. For instance, Ag-film and Al-film can be used as the metal film. The Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

According to the lighting apparatus of the present embodiment, the light shielding member 62 for shielding a part of light emitted by the light emitting element 16 is provided on the surface 67B of the optically transparent member 67 that is one of the composing elements of the light emitting device 61. Consequently, as compared with the conventional lighting apparatus 200 (see FIG. 1) provided with the light shielding plate 202 at the position spaced from the light emitting device 201, the lighting apparatus 60 can be miniaturized.

Additionally, the deterioration of the light shielding member 62 can be suppressed by providing the light shielding member 62 on the surface 67B of the optically transparent member 67, which is exposed to the airproofed space G.

Incidentally, in the foregoing description of the present embodiment, it has been described the case in which the light shielding member 62 is provided on each of the side surfaces 67B of the concave portion 67, which is at the side of the airproofed space G, by way of example. The light shielding member 51 provided on the lighting apparatus 50 of the second embodiment can be provided on the surface 67A of the optically transparent member 67, instead of the light shielding member 62.

Fourth Embodiment

Figure 11:
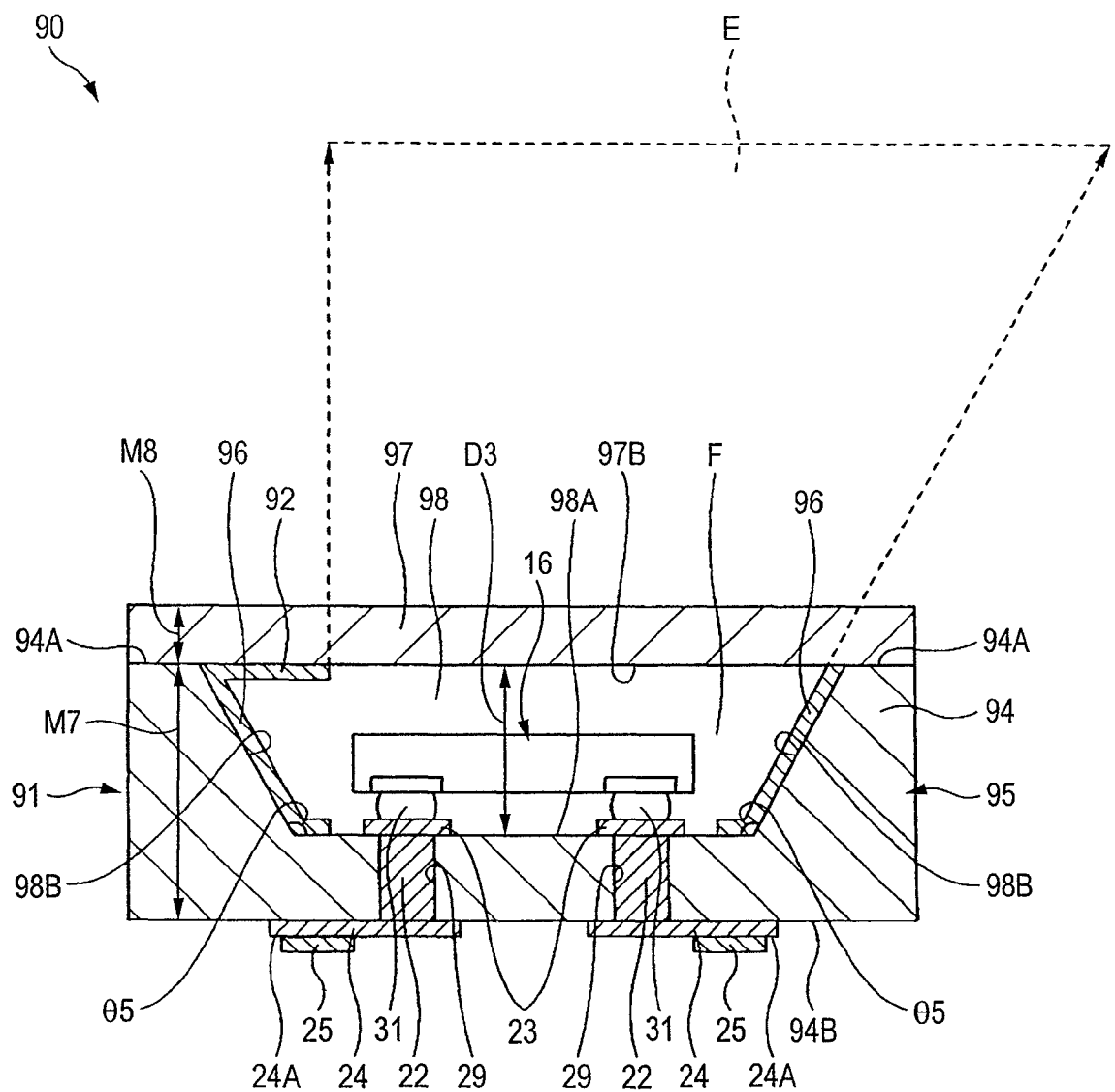
FIG. 11 is a cross-sectional view illustrating a lighting apparatus according to a fourth embodiment of the invention.
Figure 12:
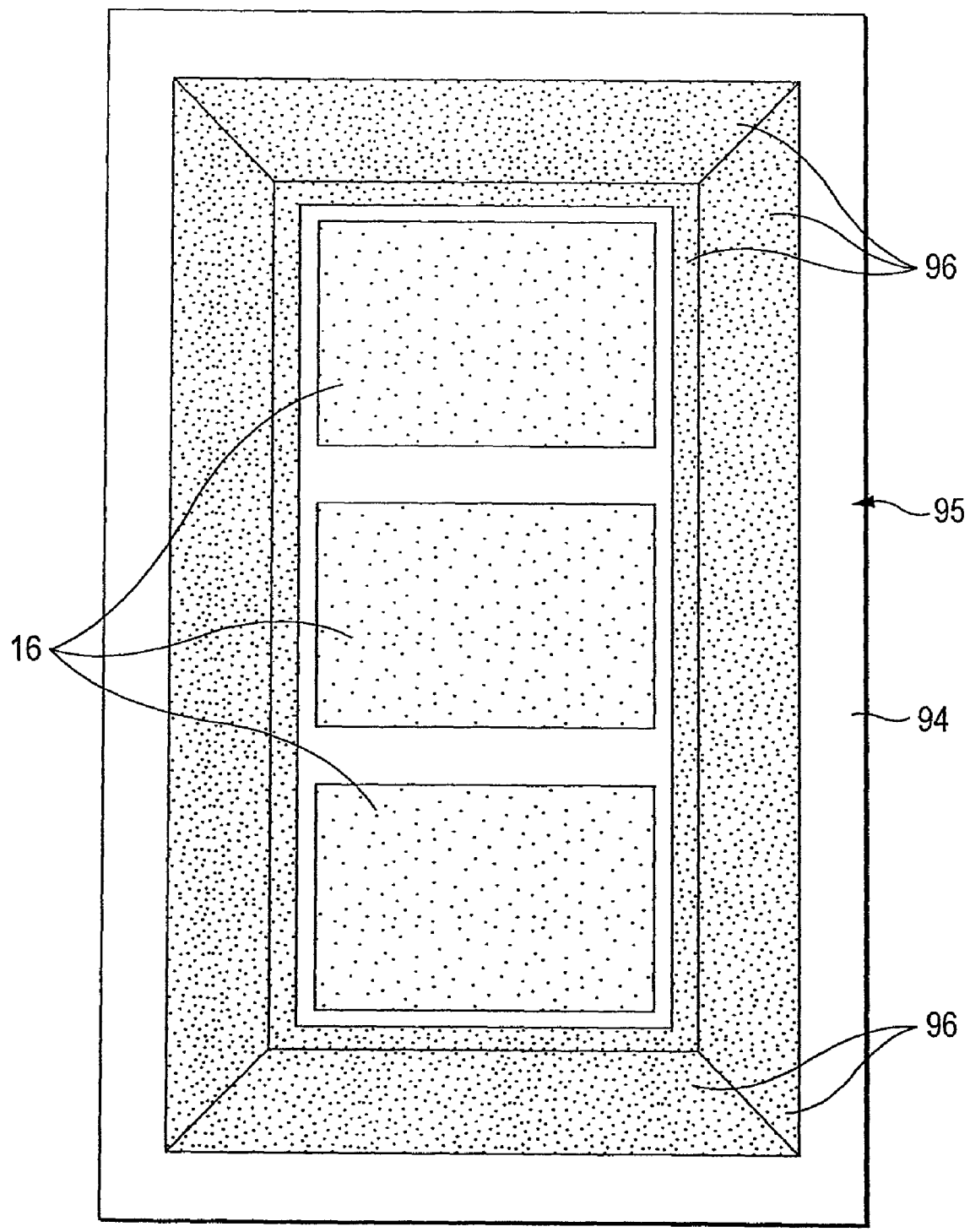
FIG. 12 is a plan view illustrating the light emitting element housing shown in FIG. 11, in which a light emitting element is accommodated.

FIG. 11 is a cross-sectional view illustrating a lighting apparatus according to a fourth embodiment of the invention. FIG. 12 is a plan view illustrating the light emitting element housing shown in FIG. 11, in which a light emitting element is accommodated. In FIG. 11, reference character E designates light irradiated from a lighting apparatus 90 in a predetermined direction. Further, in FIG. 11, like reference numeral designates a composing element similar to that of the lighting apparatus 10 of the first embodiment.

Referring to FIGS. 11 and 12, the lighting apparatus 90 according to a fourth embodiment has a light emitting device 91 and a light shielding member 92. The light emitting device 91 is constructed similarly to the lighting apparatus 11, except that the light emitting device 91 is provided with a light emitting element housing 95, a reflection member 96, and an optically transparent member 97, and with two light emitting elements 16 (i.e., the lighting apparatus 91 has three light emitting elements 16), instead of the light emitting element housing 15, the reflection member 17, and the optically transparent member 18 that are provided in the lighting apparatus 11 described in the foregoing description of the first embodiment.

The light emitting element housing 95 is constructed similarly to the housing body 21, except that the housing body 94 is provided therein instead of the light emitting element housing 15 described in the foregoing description of the first embodiment, and that the through vias 22, the first connection pads 23, the wiring patterns 24 and the second connection pads 25 are provided corresponding to each of the three light emitting elements 16 in the housing body 94.

The housing body 94 has through-holes 29 and a concave portion 98 in which the three light emitting elements 16 is accommodated. The concave portion 98 is shaped to become wider toward the optically transparent member 97 placed above the bottom surface 98A of the concave portion 98 from the bottom surface 98A of the concave portion 98 (i.e., as spaced from the bottom surface 98 of the concave portion 98). Consequently, the side surface 98B of the concave portion 98 is formed as an inclined surface. The angle θ5 between the side surface 98B and the bottom surface 98A of the concave portion 98 can be set within, for example, a range from 120 degrees to 160 degrees. The depth D3 of the concave portion 98 can be set at, for example, 250 μm.

For example, a resin, ceramics, alumina, silicon, and so forth can be used as the material of the housing body 94. Incidentally, in the case of using silicon as the material of the housing body 94, an insulating film (not shown) for insulating the housing body 94 from the through vias 22, the first connection pads 23 and the wiring patterns 24 is required to be provided on a part of the housing body 94, which corresponds to a region in which the through vias 22, the first connection pads 23, and the wiring patterns 24 are formed. For example, a 1 μm-thick oxidized film can be used as the insulating film. The thickness M7 of the housing body 94 can be set at, for example, 350 μm.

The reflection member 96 is provided on each of the side surfaces 98B and 98C of the concave portion 98 and on the bottom surface 98A adjoining the side surface 98B and 98C thereof. The reflection members 96 are members for reflecting light emitted from the three light emitting elements 16. Incidentally, in a case where the light shielding member 92 has the function of reflecting light emitted from the light emitting elements 16, the reflection member 96 reflects light reflected by the shielding member 92.

Thus, the reflection members 96 are provided on the side surfaces 98B of the concave portion 98 and the bottom surface 98A adjoining the side surfaces 98B and 98C of the concave portion 98. Consequently, light emitted from the side surfaces and the bottom surface of the three light emitting elements 16 is reflected. Thus, the reflected light can be radiated to the outside of the lighting apparatus 90. Accordingly, the luminance of the lighting apparatus 90 can be enhanced.

For example, a metal plate and a metal film, whose surfaces adapted to receive light from the three light emitting element 16 are formed as a substantial mirror surface, can be used as the reflection members 96. For instance, Ag and Al can be used as the material of the metal plate. For example, Ag-film and Al-film can be used as the metal film. Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

The optically transparent member 97 is provided on the top surface 94A of the housing body 94 so as to airproof a space F formed by the concave portion 98. The optically transparent member 97 is constituted by a material that can transmit light emitted from light emitting element 16. For example, glass can be used as the material of the optically transparent member 97. The thickness M8 of the optically transparent member 97 can be set at, for example, 200 μm.

Figure 13:
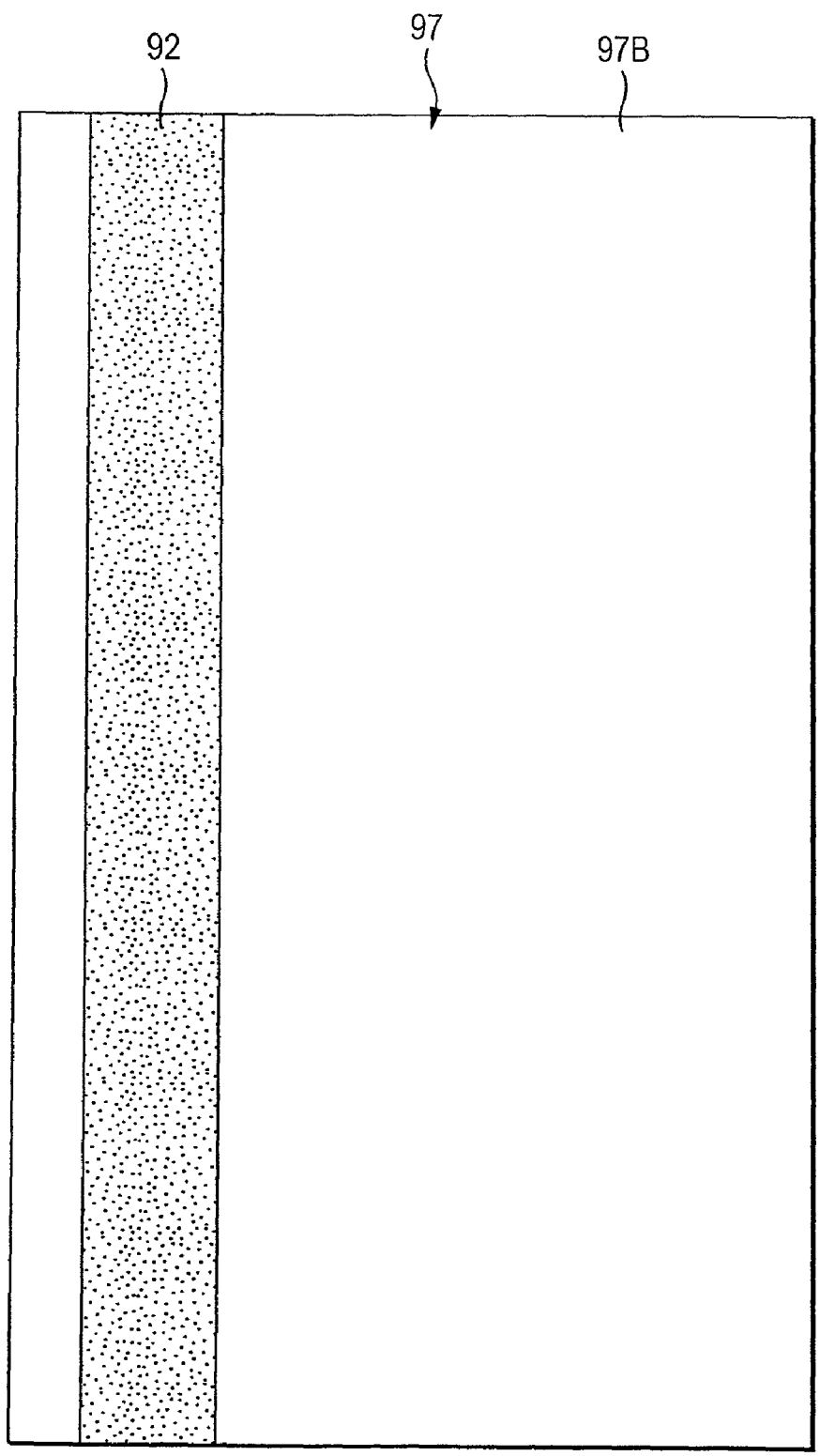
FIG. 13 is a plan view illustrating an optically transparent member provided with a light shielding member shown in FIG. 11.

FIG. 13 is a plan view illustrating an optically transparent member provided with a light shielding member shown in FIG. 11.

Referring to FIGS. 11 and 13, the light shielding member 92 is provided on the surface 97B of the optically transparent member 97. The surface 97B of the optically transparent member 97 is a surface thereof exposed to the airproofed space F. The light shielding member 92 is a member for irradiating light, which is emitted by the three light emitting elements 16, in a predetermined direction by shielding a part of light emitted by the three light emitting elements 16.

Thus, the light shielding member 92 adapted to shield a part of light emitted by the three light emitting element 16 is provided on the surface 97B of the optically transparent member 97 that is one of composing elements of the light emitting device 91. Consequently, as compared with the conventional lighting apparatus 200 (see FIG. 1) provided with the light shielding plate 202 at the position spaced from the light emitting device 201, the lighting apparatus 90 can be miniaturized.

Additionally, the deterioration of the light shielding member 92 can be suppressed by providing the light shielding member 92 on the surface 97B of the optically transparent member 97, which is exposed to the airproofed space F.

For example, a metal film, whose surface receiving light emitted from the light emitting element 16 is formed as a substantial mirror surface, can be used as the light shielding member 92. For instance, Ag-film and Al-film can be used as the metal film. The Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

According to the lighting apparatus of the present embodiment, the light shielding member 92 for shielding a part of light emitted by the three light emitting elements 16 is provided on the surface 97B of the optically transparent member 97 that is one of the composing elements of the light emitting device 91. Consequently, as compared with the conventional lighting apparatus 200 (see FIG. 1) provided with the light shielding plate 202 at the position spaced from the light emitting device 201, the lighting apparatus 90 can be miniaturized.

Additionally, the deterioration of the light shielding member 92 can be suppressed by providing the light shielding member 92 on the surface 97B of the optically transparent member 97, which is exposed to the airproofed space F.

Additionally, the three light emitting elements 16 are provided in the concave portion 98. Thus, the luminance of the lighting apparatus 90 can be enhanced.

Incidentally, in the foregoing description of the present embodiment, it has been described the case in which the three light emitting elements 16 are accommodated in the concave portion 98, by way of example. The number of the light emitting elements 16 accommodated in the concave portion 98 can be either two or three or more. Additionally, in a case where the lighting apparatus 90 according to the present embodiment is applied to a projector, the three light emitting elements 16 can be a red light emitting element, a blue light emitting element, and a green light emitting element. Consequently, a color image can be projected using the lighting apparatus 90.

Incidentally, a plurality of light emitting elements 16 can be provided in each of the lighting apparatuses 10, 50, and 60 of the previously described first to third embodiments and the lighting apparatus 40 of the modification of the first embodiment.

Fifth Embodiment

Figure 14:
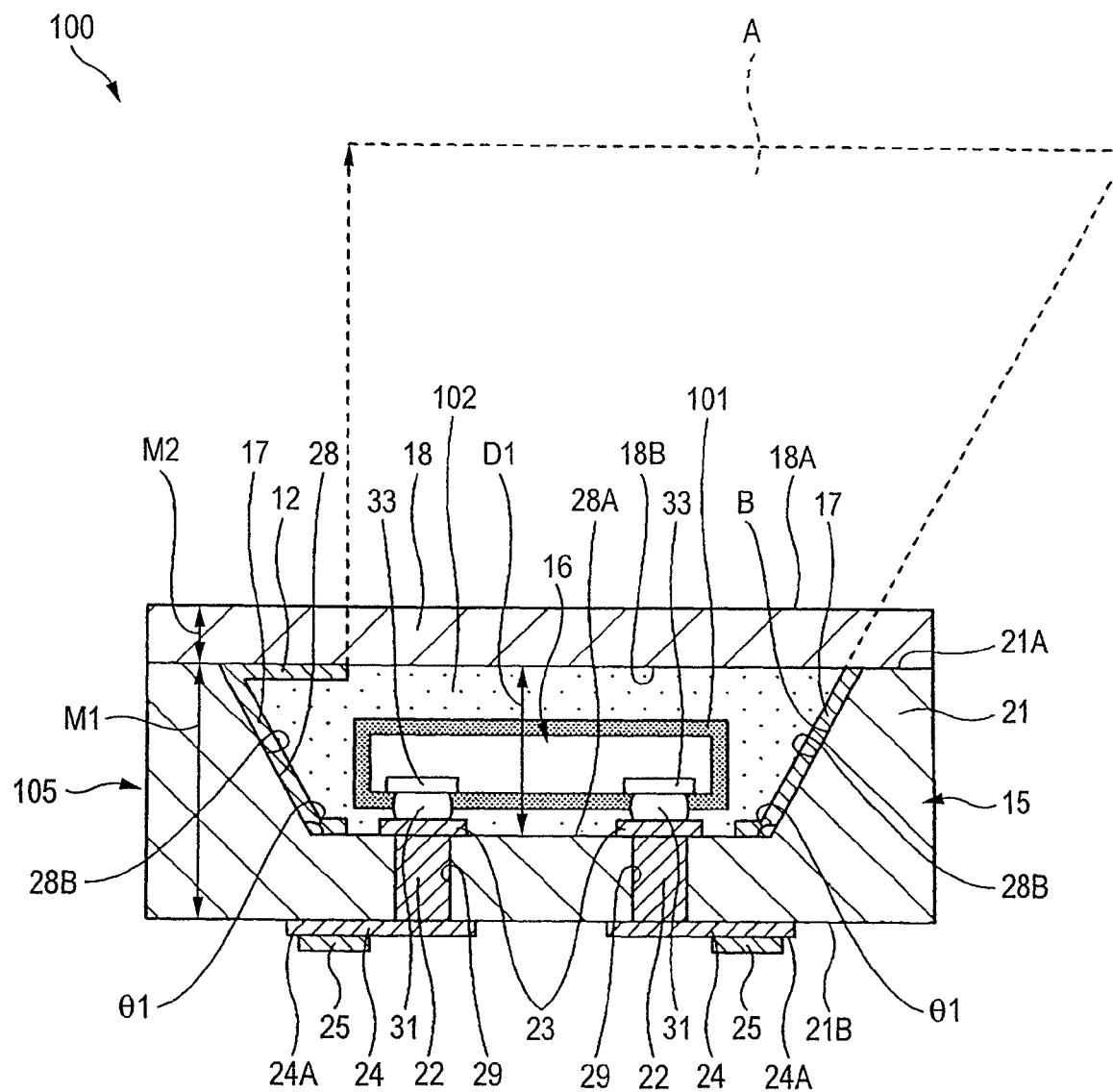
FIG. 14 is a cross-sectional view illustrating a lighting apparatus according to a fifth embodiment of the invention.

FIG. 14 is a cross-sectional view illustrating a lighting apparatus according to a fifth embodiment of the invention. In FIG. 14, like reference numeral designates a composing element similar to that of the lighting apparatus 10 of the first embodiment.

Referring to FIG. 14, a lighting apparatus 100 of the fifth embodiment is similar to the lighting apparatus 10 of the first embodiment, except that a light shielding device 105 is provided in the apparatus, instead of the light emitting element 11 provided in the lighting apparatus 10 of the first embodiment.

The light emitting device 105 is configured similarly to the lighting apparatus 11, except that a resin containing a fluorescent material 101 and a seal resin 102 are added to the configuration of the lighting apparatus 11.

The resin containing a fluorescent material 101 is provided to cover the light emitting element 16. The resin containing a fluorescent material 101 is a resin obtained by causing a transparent resin to contain a fluorescent material. For example, a silicone resin can be used as the transparent resin.

Thus, the deterioration of the resin containing a fluorescent material due to ultraviolet, which is included in light emitted from the light emitting element 16 and passes through the resin containing a fluorescent material 101, can be suppressed by using a silicone resin as the transparent resin.

In a case where white light is radiated from the lighting apparatus 100, for example, a blue light emitting diode or laser diode can be used as the light emitting element 16. In this case, for example, yellow-emission phosphor particles can be used as phosphor particles contained in the resin containing a fluorescent material 101. For instance, YSG phosphor can be used as the yellow-emission phosphor.

The seal resin 102 is provided to fill in the space B. The seal resin 102 is used to seal the light emitting element 16 covered with the resin containing the fluorescent material. For example, a silicone resin can be used as the seal resin 102.

The lighting apparatus 100 of the aforementioned configuration is manufactured as follows. The light emitting element 15 covered with the resin containing the fluorescent material 101 is flip-chip bonded to the first connection pad 23. Subsequently, a seal resin 102 is formed so that the space B is filled with the seal resin. Thereafter, an optically transparent member 18 provided with a light shielding member 18 is fixed to the top surface 21A of a housing body 21.

The lighting apparatus 100 of such a configuration can obtain advantages similar to those of the lighting apparatus 10 according to the first embodiment.

Incidentally, in the foregoing description of the lighting apparatus 100 according to the fifth embodiment, it has been described the case that the signal light emitting element 16 is provided therein, by way of example. However, a plurality of light emitting elements 16 can be provided in the concave portion 28.

Also, the resin containing the fluorescent material 101, and the seal resin 102 described in the description of the fifth embodiment can be provided in the lighting apparatuses 10, 50, 60, and 90, which are respectively implemented according to the first to fourth embodiments, and in the lighting apparatus 40 according to the modification of the first embodiment.

Sixth Embodiment

Figure 15:
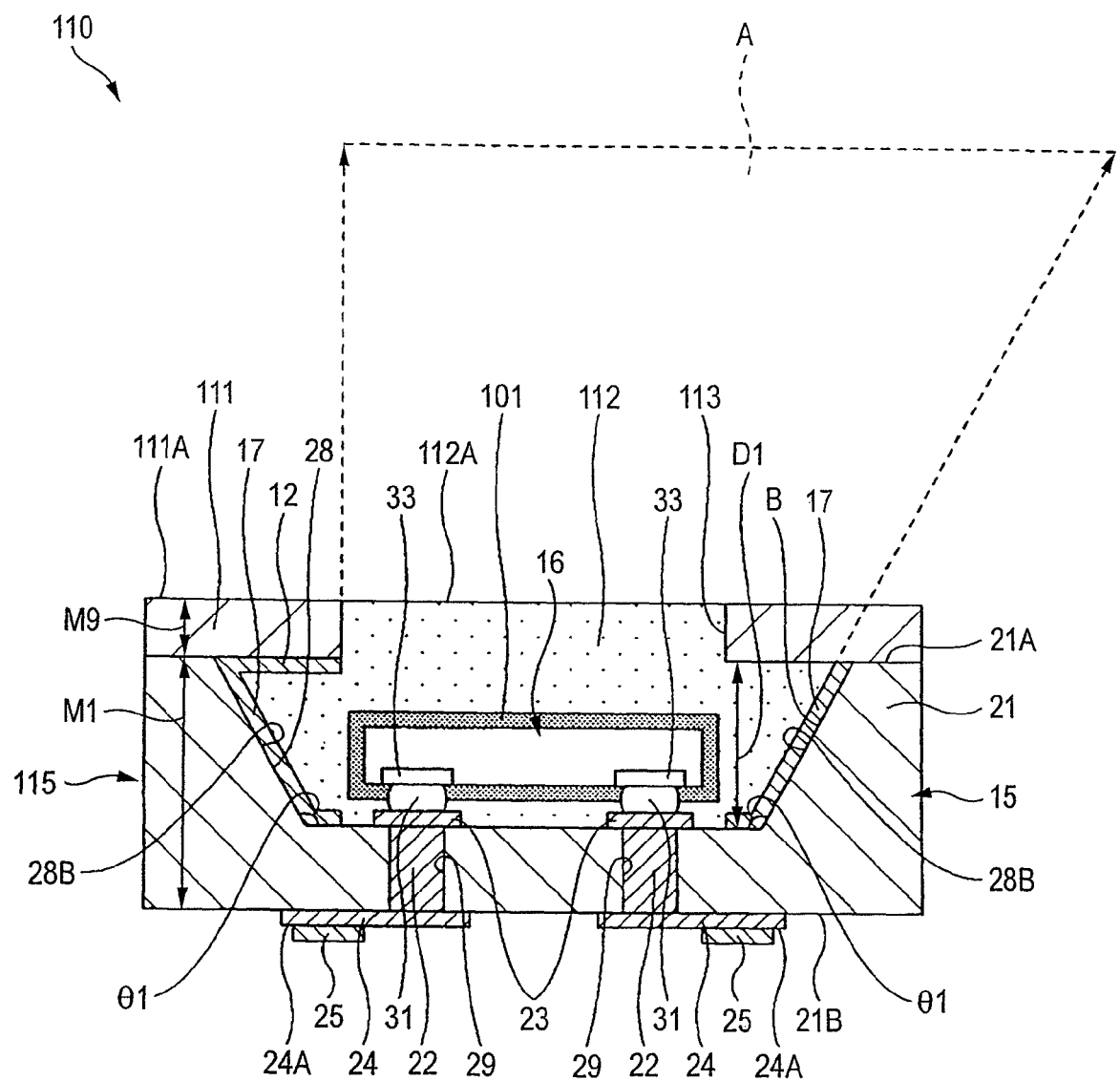
FIG. 15 is a cross-sectional view illustrating a lighting apparatus according to a sixth embodiment of the invention.

FIG. 15 is a cross-sectional view illustrating a lighting apparatus according to a sixth embodiment of the invention. In FIG. 15, like reference numeral designates a composing element similar to that of the lighting apparatus 10 according to the first embodiment.

Referring to FIG. 15, a lighting apparatus 110 according to the sixth embodiment is configured similarly to the lighting apparatus 100, except that a light emitting device 115 is provided in the lighting apparatus 110, instead of the light emitting device 105 provided in the lighting apparatus 100 according to the fifth embodiment.

The light emitting device 115 is configured similarly to the light emitting device 105, except that an optically transparent member 111 and a seal resin 112 are provided in the light emitting device 115, instead of the optically transparent member 18 and the seal resin 102 provided in the light emitting device 105 having been described in the foregoing description of the fifth embodiment.

Figure 16:
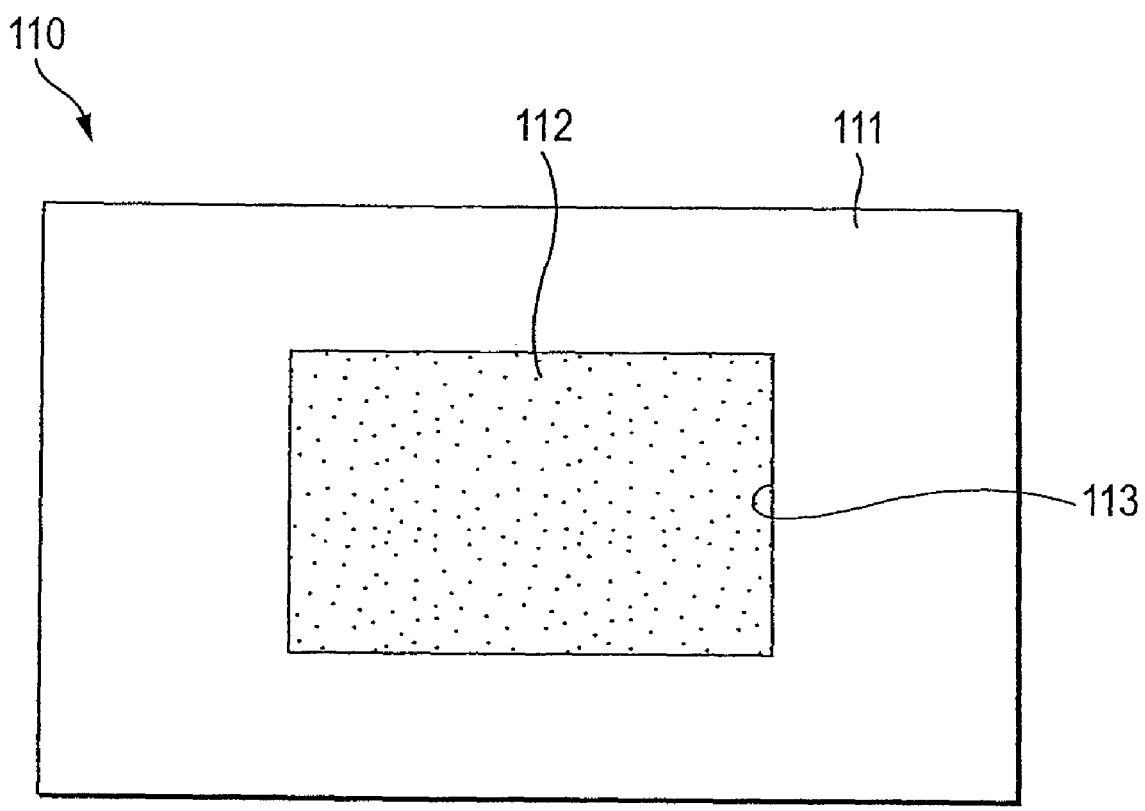
FIG. 16 is a plan view illustrating the lighting apparatus according to the sixth embodiment of the invention.

FIG. 16 is a plan view illustrating the lighting apparatus according to the sixth embodiment of the invention.

Referring to FIGS. 15 and 16, the optically transparent member 111 is provided on the top surface 21A of a housing body 21. The optically transparent member 111 has a through portion 113 for introducing the seal resin 112 into the space B.

Thus, the optically transparent member 111 is provided in the through portion 113. When the lighting apparatus 110 is manufactured, the seal resin 112 can be introduced into the space B through the through portion 113 after the optically transparent member 111 is fixed to the top surface 21A of a substrate body 21.

The optically transparent member 111 is constituted by a material that can transmit light emitted from light emitting element 16. For example, glass can be used as the material of the optically transparent member 111. The thickness M9 of the optically transparent member 111 can be set at, for example, 200 μm. Also, the optically transparent member 111 can be formed by machining the through portion 113 in the optically transparent member 18 provided in the lighting apparatus 100 according to the fifth embodiment.

The seal resin 112 is provided so that the space B and the through portion 113 are filled with the seal resin 112. The top surface 112A of the seal resin 112 provided in the through portion 113 is formed to be substantially flush with the surface 111A of the optically transparent member 111. For example, a silicone resin can be used as the seal resin 112.

The lighting apparatus 110 of such a configuration according to the invention can have advantages similar to those of the lighting apparatus 100 according to the fifth embodiment.

Incidentally, the through portion for introducing the seal resin 112 into the optically transparent members 18, 67, and 97 can be formed in the optically transparent members 18, 67, and 97 that are provided in the lighting apparatuses 10, 50, 60, and 90, which are respectively implemented according to the aforementioned first to fourth embodiments, and the lighting apparatus 40 according to the modification of the first embodiment. Additionally, the light emitting element 16 covered with the resin containing the fluorescent material 101 can be sealed with the seal resin 112.

Seventh Embodiment

Figure 17:
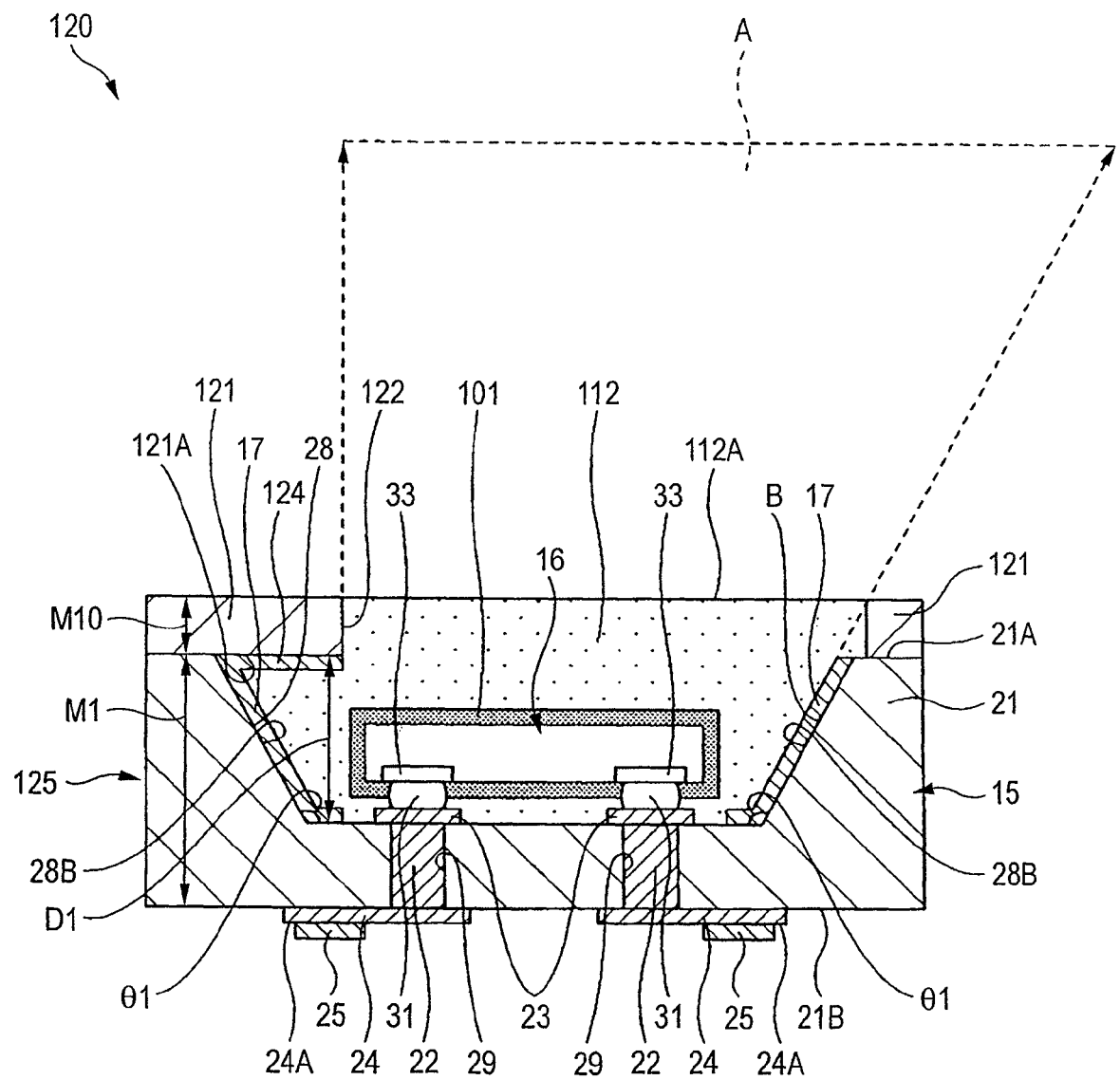
FIG. 17 is a cross-sectional view illustrating a lighting apparatus according to a seventh embodiment of the invention.

FIG. 17 is a cross-sectional view illustrating a lighting apparatus according to a seventh embodiment of the invention. In FIG. 17, like reference numeral designates a composing element similar to that of the lighting apparatus 110 according to the sixth embodiment.

Referring to FIG. 17, a lighting apparatus 120 according to the seventh embodiment is configured similarly to the lighting apparatus 110, except that a light emitting device 125 and a reflection member 124 are provided in the lighting apparatus 120, instead of the light emitting device 115 and the light shielding member 12 provided in the lighting apparatus 110 according to the sixth embodiment.

The light emitting device 125 is configured similarly to the light emitting device 115, except that a plate body 121 is provided in the light emitting device 115, instead of the optically transparent member 111 provided in the light emitting device 115 having been described in the foregoing description of the sixth embodiment.

Figure 18:
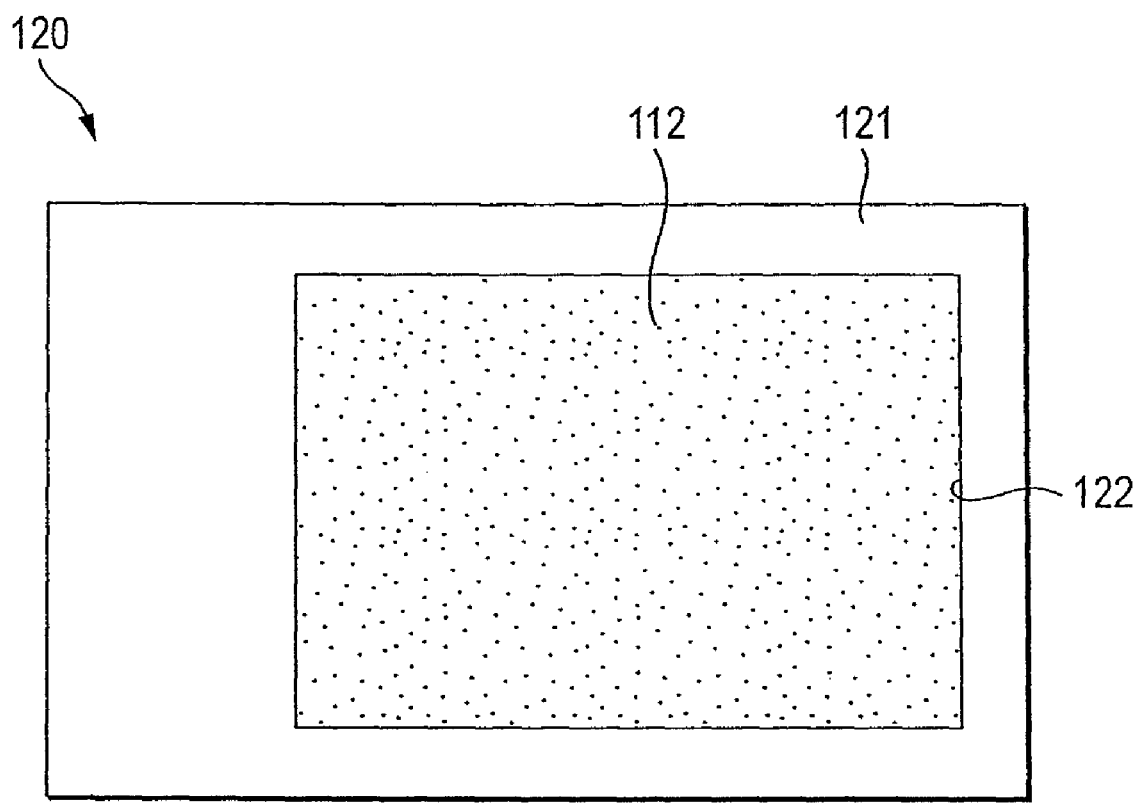
FIG. 18 is a plan view illustrating the lighting apparatus according to the seventh embodiment of the invention.

FIG. 18 is a plan view illustrating the lighting apparatus according to the seventh embodiment of the invention.

Referring to FIGS. 17 and 18, the plate body 121 is provided on the top surface 21A of a housing body 21. The plate body 121 is constituted by a material that does not transmit light. The plate body 121 has a through portion 122 for causing light emitted by the light emitting element 16 to pass therethrough in a predetermined direction. The plate body 121 is formed into a shape in which a part of the plate body 121 protrudes above the seal resin 112 provided in the concave portion 28. For example, a metal plate and a silicon substrate can be used as the plate body 121. The thickness M10 of the plate body 121 can be set at, for example, 200 μm.

A reflection member 124 (i.e., a second reflection member) is provided to cover the bottom surface 121A of the part of the plate body 121, which is protruded above the seal resin 112. The reflection member 124 is a member for reflecting light emitted by the light emitting element 16 so that the reflected light is directed to the reflection member 17 (i.e., the first reflection member according to the seventh embodiment).

Thus, the reflection member 124 for reflecting light emitted by the light emitting element 16 so as to direct the reflected light toward the reflection member 124 is provided in the lighting apparatus 120. Consequently, light reflected by the reflection member 124 can be irradiated to the outside of the lighting apparatus 120 through the reflection member 17. Accordingly, the luminance of the lighting apparatus 120 can be enhanced.

For example, a metal plate and a metal film, whose surfaces adapted to receive light from the light emitting element 16 are formed as a substantial mirror surface, can be used as the reflection members 124. For instance, Ag and Al can be used as the material of the metal plate. For example, Ag-film and Al-film can be used as the metal film. Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

Also, the lighting apparatus 120 of the aforementioned configuration according to the invention can have advantages similar to those of the lighting apparatus 110 according to the sixth embodiment.

Incidentally, although it has been described in the foregoing description of the lighting apparatus 120 according to the seventh embodiment the case that a single light emitting element 16 is provided in the concave portion 28, a plurality of light emitting elements 16 can be provided in the concave portion 28.

Eighth Embodiment

Figure 19:
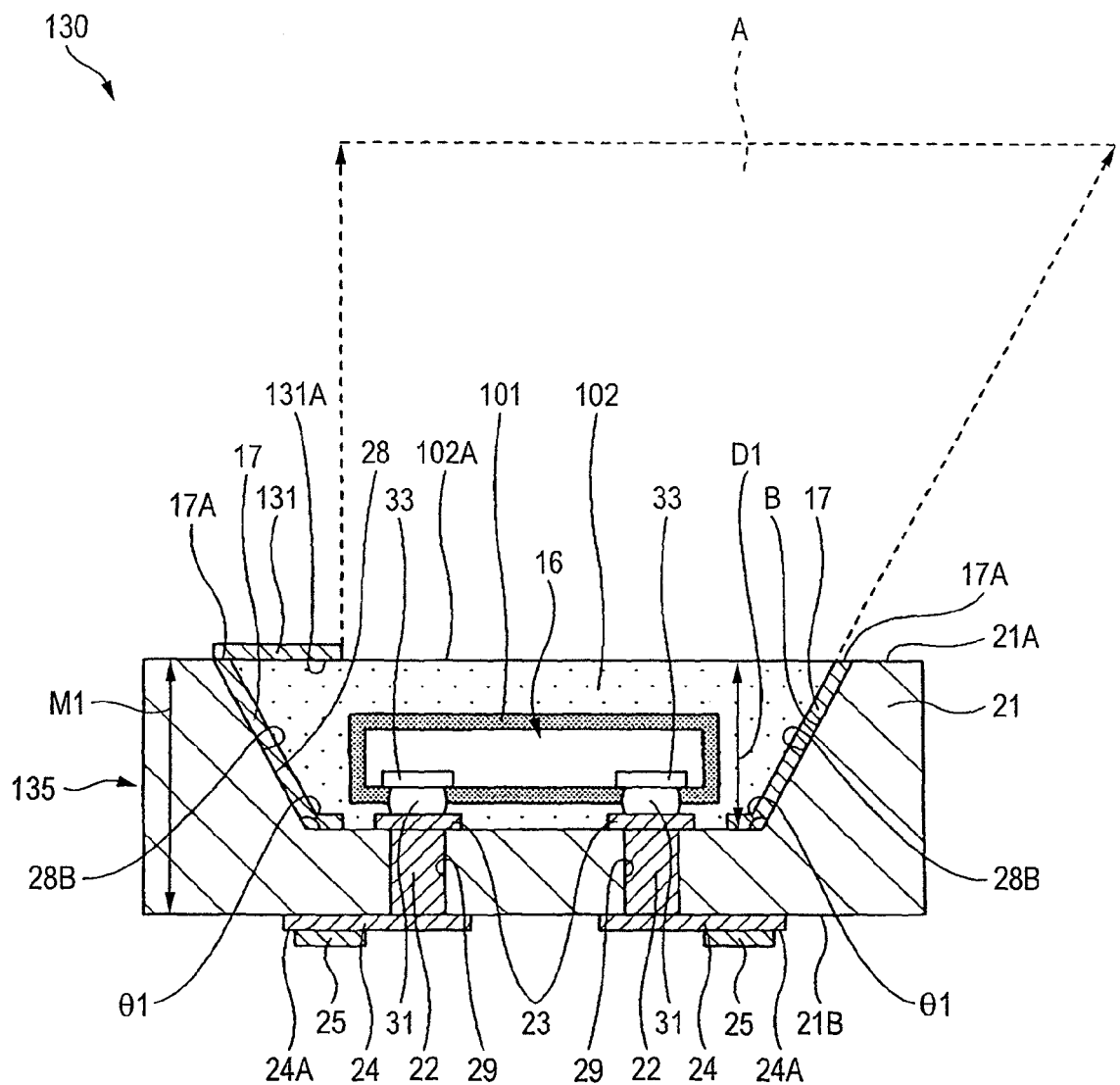
FIG. 19 is a cross-sectional view illustrating a lighting apparatus according to an eighth embodiment of the invention.

FIG. 19 is a cross-sectional view illustrating a lighting apparatus according to an eighth embodiment of the invention. In FIG. 19, like reference numeral designates a composing element similar to that of the lighting apparatus 100 according to the fifth embodiment.

Referring to FIG. 19, a lighting apparatus 130 according to the eighth embodiment has a light emitting device 135 and a light shielding member 131. The light emitting device 135 is configured similarly to the lighting apparatus 105, except that the optically transparent member 18 provided in the light emitting device 105 having been described in the description of the fifth embodiment is removed from the composing elements, that a light shielding element 131 is provided instead of the light shielding member 12 provided in the light emitting device 105, and that the entire top surface 102A of the seal resin 102 provided in the light emitting device 105 is set to be substantially flush with the top surface 21A of the housing body 21.

Figure 20:
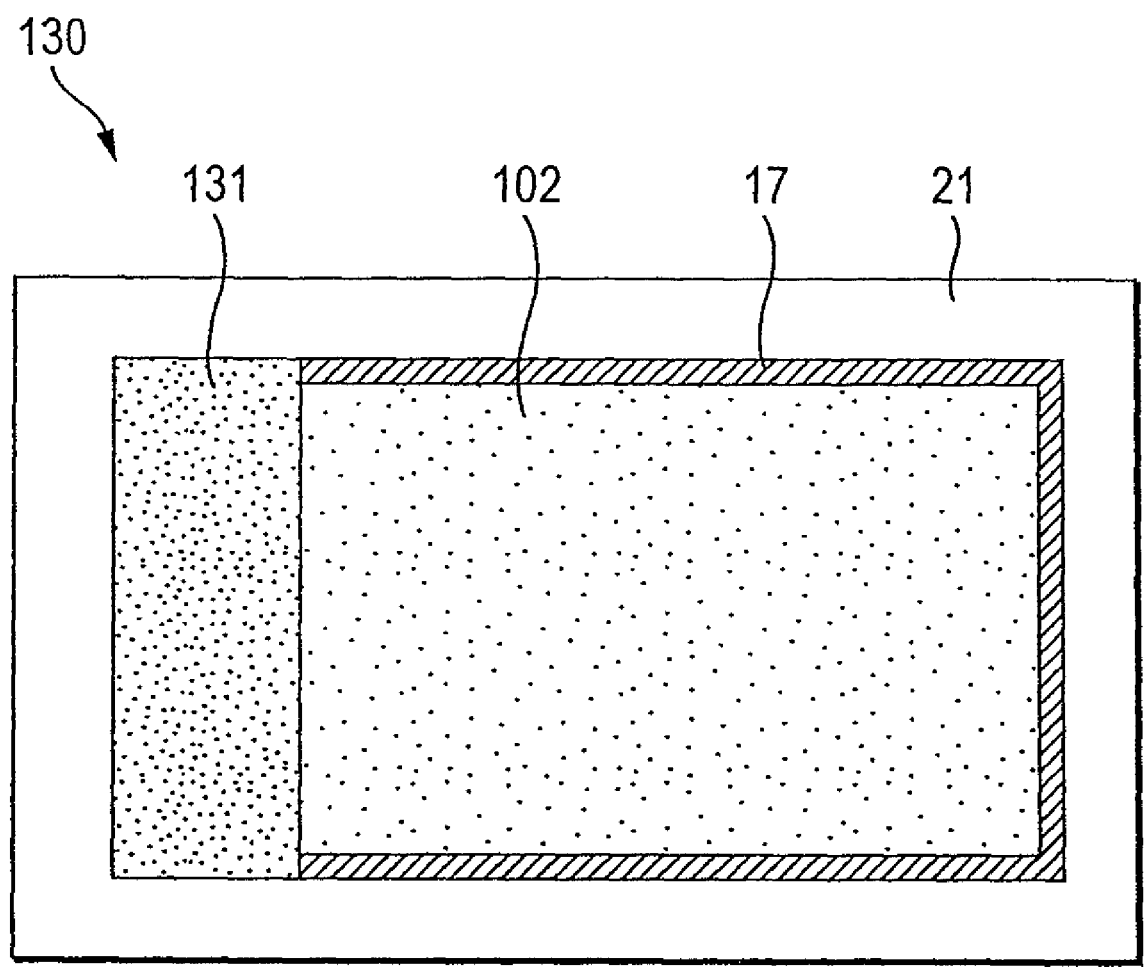
FIG. 20 is a plan view illustrating the lighting apparatus according to then eighth embodiment of the invention.

FIG. 20 is a plan view illustrating the lighting apparatus according to the eighth embodiment of the invention.

Referring to FIGS. 19 and 20, the light shielding member 131 is provided on the surface 102A of the seal resin 102. The bottom surface 131A of the light shielding member 131 is in contact with the surface 17A of the reflection member 17, which is substantially flush with the top surface 21A of the housing body 21. The light shielding member 131 has the function of shielding light emitted from the light emitting element 16. The light shielding member 131 is a member for irradiating light, which is emitted from the light emitting element 16, in a predetermined direction by shielding a part of light emitted by the light emitting element 16.

For example, a metal plate and a silicon substrate can be used as the light shielding member 131. For instance, Ag and Al can be used as the material of the metal plate. Further, in a case where a metal plate is used as the light shielding member 131, the bottom surface 131A of the light shielding member 131 is formed as a substantial mirror surface. Consequently, the light shielding member 131 functions as a reflection plate which reflects light emitted from the light emitting element 16. Accordingly, the luminance of the lighting apparatus 130 can be enhanced.

According to the lighting apparatus of the Eighth embodiment, the light shielding member 131 for shielding a part of light emitted by the light emitting element 16 is provided directly on the seal resin 102 that is a composing element of the light emitting device 135. Consequently, as compared with the case of providing the light shielding member 131 on the optically transparent member 18 (see FIG. 14), the lighting apparatus 130 can be further miniaturized.

Additionally, the metal plate, whose bottom surface 131A is formed as a substantial mirror surface, is used as the light shielding member 131. Consequently, the light shielding member 131 functions as a reflection plate that reflects light emitted from the light emitting element 16. Consequently, the luminance of the lighting apparatus can be enhanced.

Incidentally, a plurality of light emitting elements 16 can be provided in the concave portion 28 of the lighting apparatus 130 according to the eighth embodiment.

Figure 21:
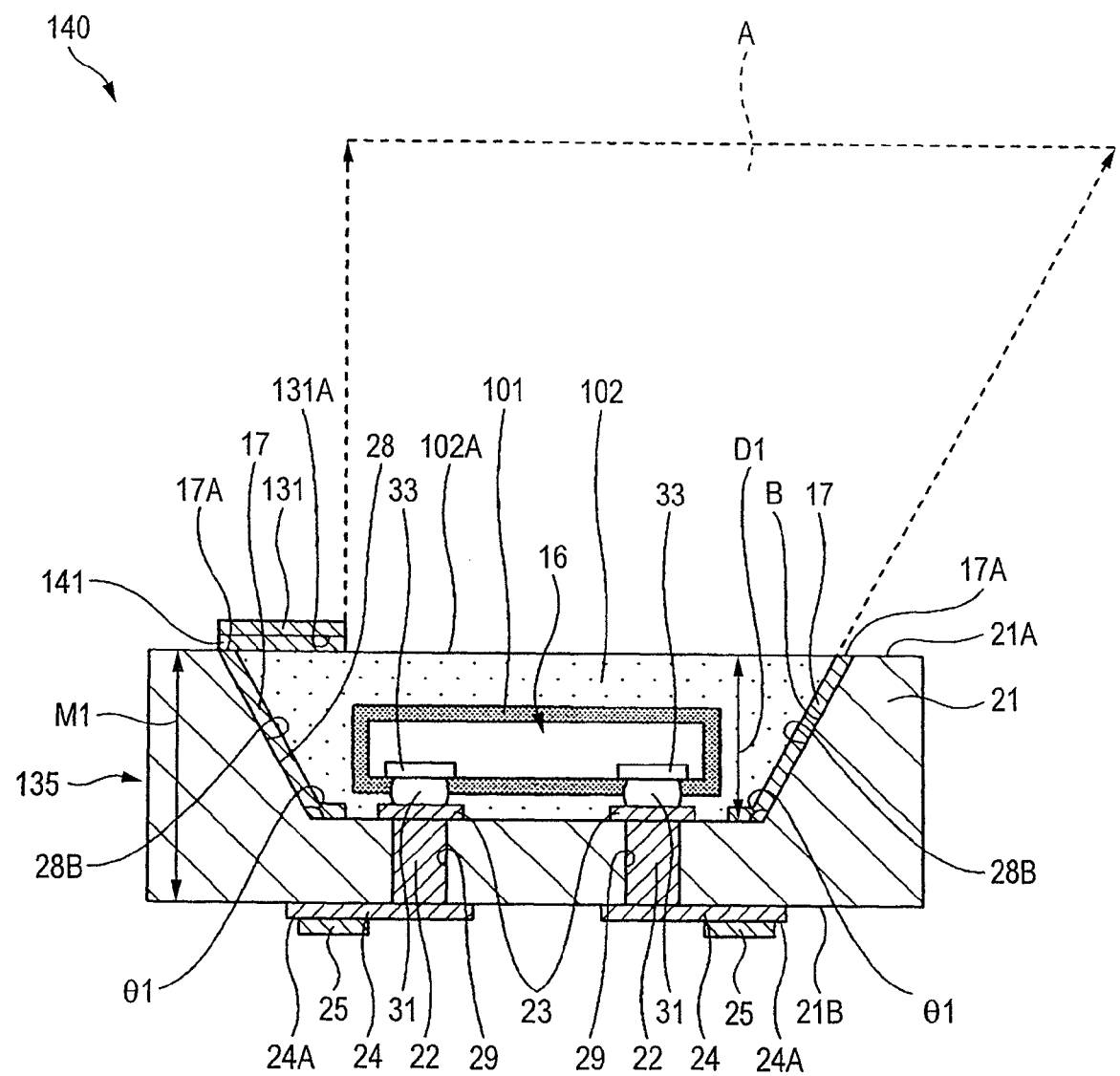
FIG. 21 is a cross-sectional view illustrating a lighting apparatus according to a modification of the eighth embodiment of the invention.

FIG. 21 is a cross-sectional view illustrating a lighting apparatus according to a modification of the eighth embodiment of the invention. In FIG. 21, like reference numeral designates a composing element similar to that of the lighting apparatus 130 according to the eighth embodiment.

Referring to FIG. 21, a lighting apparatus 140 according to the modification of the eighth embodiment is constituted similarly to the lighting apparatus 130, except that a reflection member 141 is provided by being added to the composing elements of the lighting apparatus 130 according to the seventh embodiment.

The reflection member 141 is provided to cover the bottom surface 131A of the light shielding member 131. The reflection member 141 is a member for reflecting light, which is emitted from the light emitting element 16, to direct the reflected light toward the reflection member 17.

Thus, the reflection member 141 for reflecting light, which is emitted by the light emitting element 16, toward the reflection member 17 is provided. Consequently, light reflected by the reflection member 141 can be irradiated to the outside of the lighting apparatus 140 through the reflection member 17. Accordingly, the luminance of the lighting apparatus 140 can be enhanced.

For example, a metal plate and a metal film, whose surfaces adapted to receive light from the light emitting element 16 are formed as a substantial mirror surface, can be used as the reflection members 141. For instance, Ag and Al can be used as the material of the metal plate. For example, Ag-film and Al-film can be used as the metal film. Ag-film can be formed by, for example, an inkjet method, a vacuum deposition method, and a plating method. The thickness of Ag-film can be set at, for example, 10 μm. Al-film can be formed by, for example, a sputter method. The thickness of Al-film can be set to be, for example, 2 μm to 3 μm.

Besides, in the Second to Eighth embodiments, although the shielding plate is provided only on the left side in the figures, it may be also provided on the right side.

Although preferred embodiments of the invention have been described in detail in the foregoing description, the invention is not limited to such specific embodiments. Various modifications and alterations may be made within a scope of the gist of the invention set forth in claims.

The invention can be applied to a lighting apparatus irradiating light, which is emitted from a light emitting device, in a predetermined direction.

What is claimed is:

1. A lighting apparatus comprising:
    a light emitting device including:
        one or a plurality of light emitting elements covered by a resin containing a fluorescent material,
        a light emitting element housing having a concave portion accommodating the one or the plurality of light emitting elements, and
        a seal resin that is provided in a space formed by the concave portion and seals the one or the plurality of light emitting elements,
    the concave portion being shaped to become wider with distance from a bottom surface of the concave portion, and
    a light shielding member, provided on the seal resin, for shielding a part of light emitted by the one or the plurality of light emitting elements, wherein
    light emitted from the one or the plurality of light emitting elements is irradiated in a predetermined direction,
    wherein the light shielding member is a metal plate whose surface for receiving light emitted from the one or the plurality of light emitting elements is formed as a substantial mirror surface, and
    wherein the light shielding member is provided directly on the seal resin such that the surface for receiving light is in contact with a top surface of the seal resin.

2. The lighting apparatus according to claim 1, further comprising:
    a reflection member, provided on a side surface of the concave portion and/or a bottom surface of the concave portion, for reflecting light emitted from the one or the plurality of light emitting elements.

3. The lighting apparatus according to claim 1, wherein the light shielding member includes a metal film whose surface for receiving light emitted from the one or the plurality of light emitting elements is formed as a substantial mirror surface.

4. The lighting apparatus according to claim 1, wherein the light emitting element is an LED.

* * * * *